United States Patent
Rafac et al.

(10) Patent No.: US 9,232,623 B2
(45) Date of Patent: Jan. 5, 2016

(54) EXTREME ULTRAVIOLET LIGHT SOURCE

(71) Applicant: ASML Netherlands B.V., Veldhoven (NL)

(72) Inventors: Robert J. Rafac, Encinitas, CA (US); Richard L. Sandstrom, Encinitas, CA (US); Daniel Brown, San Diego, CA (US); Kai-Chung Hou, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/489,411

(22) Filed: Sep. 17, 2014

(65) Prior Publication Data

US 2015/0208494 A1 Jul. 23, 2015

Related U.S. Application Data

(60) Provisional application No. 61/930,392, filed on Jan. 22, 2014.

(51) Int. Cl.
*H05G 2/00* (2006.01)

(52) U.S. Cl.
CPC .................... *H05G 2/008* (2013.01)

(58) Field of Classification Search
USPC ............... 250/493.1, 503.1, 504 R
See application file for complete search history.

(56) References Cited

U.S. PATENT DOCUMENTS

| 6,973,164 | B2 | 12/2005 | Hartlove |
|---|---|---|---|
| 7,239,686 | B2 | 7/2007 | Berglund |
| 7,491,954 | B2 | 2/2009 | Bykanov |
| 7,916,388 | B2 | 3/2011 | Bykanov |
| 7,923,705 | B2 | 4/2011 | Moriya |
| 8,242,472 | B2 | 8/2012 | Moriya |
| 2006/0255298 | A1 | 11/2006 | Bykanov |
| 2010/0051831 | A1 | 3/2010 | Tao |
| 2010/0181503 | A1 | 7/2010 | Yanagida |
| 2010/0193710 | A1 | 8/2010 | Wakabayashi |
| 2011/0057126 | A1 | 3/2011 | Hoshino |
| 2011/0317256 | A1 | 12/2011 | Hou |

(Continued)

FOREIGN PATENT DOCUMENTS

WO 2013029906 A1 3/2013

OTHER PUBLICATIONS

International Search Report for counterpart International Application No. PCT/EP2015/050859, mailed Apr. 28, 2015, 3 pages.

(Continued)

*Primary Examiner* — Nicole Ippolito
*Assistant Examiner* — Hanway Chang
(74) *Attorney, Agent, or Firm* — DiBerardino McGovern IP Group LLC

(57) ABSTRACT

A target material is provided at a target location, the target material including a material that emits extreme ultraviolet light when converted to plasma, and the target material extending in a first extent along a first direction and in a second extent along a second direction; an amplified light beam is directed along a direction of propagation toward the target location; and the amplified light beam is focused in a focal plane, where the target location is outside of the focal plane and an interaction between the amplified light beam and the target material converts at least part of the target material to plasma that emits EUV light.

28 Claims, 17 Drawing Sheets

(56) References Cited

U.S. PATENT DOCUMENTS

| | | |
|---|---|---|
| 2012/0092746 A1 | 4/2012 | Hou |
| 2012/0228525 A1 | 9/2012 | Moriya |
| 2012/0235066 A1 | 9/2012 | Ershov |
| 2012/0305811 A1 | 12/2012 | Wakabayashi |
| 2012/0307851 A1 | 12/2012 | Hori |

OTHER PUBLICATIONS

Written Opinion of the International Searching Authority for counterpart International Application No. PCT/EP2015/050859, mailed Apr. 28, 2015, 6 pages.

Fujimoto et al., "Development of Laser-Produced Tin Plasma-Based EUV Light Source Technology for HVM EUV Lithography", Physics Research International, vol. 2012, Article ID-249495, 2012, 8 pages.

Garban-Labaune et al., "Resonance Absorption in CO2 Laser-Plane Targets Interaction Experiments", Journal De Physique-Lettres, vol. 41, No. 19, Oct. 1980, pp. 463-467.

Larsen, Jon T., "Absorption and Profile Modification on Spherical Targets for. $25 < \lambda < 2$ Microns", Lawrence Livermore Laboratory, Presentation at the 8th Annual Conference on Anomalous Absorption of Electromagnetic Waves, Tucson, Arizona, Apr. 4, 1978, 48 pages.

Nakano et al., "Sn Droplet Target Development for Laser Produced Plasma EUV Light Source", Emerging Lithographic Technologies XII., Edited by Schellenberg, Frank M., Proceedings of the SPIE, vol. 6921, Article ID. 692130, 2008, 8 pages.

Hassanein et al., "Combined Effects of Prepulsing and Target Geometry on Efficient Extreme Ultraviolet Production from Laser Produced Plasma Experiments and Modelling", Journal of Micro/Nanolithography, MEMS, and MOEMS, vol. 10, No. 3, Jul.-Sep. 2011, 7 pages.

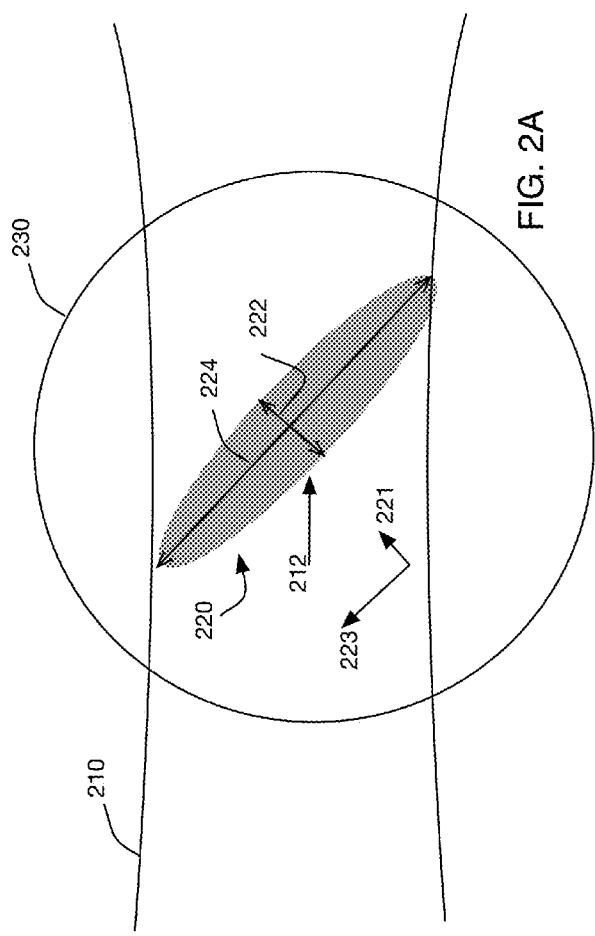
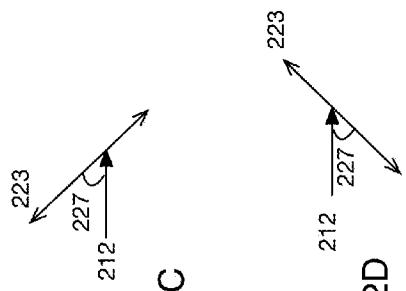
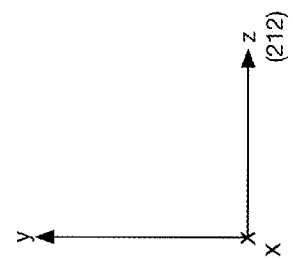

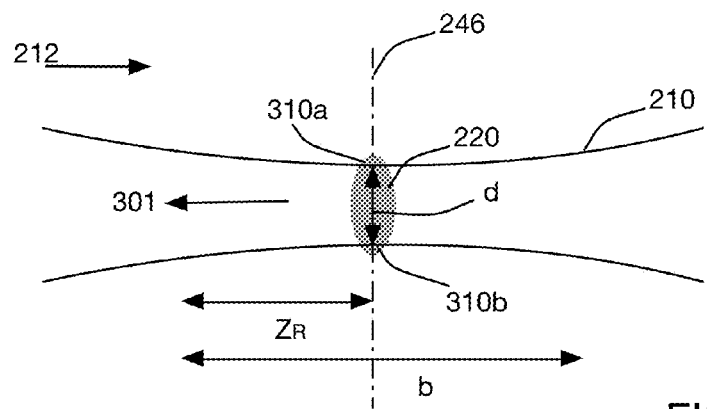
FIG. 3A
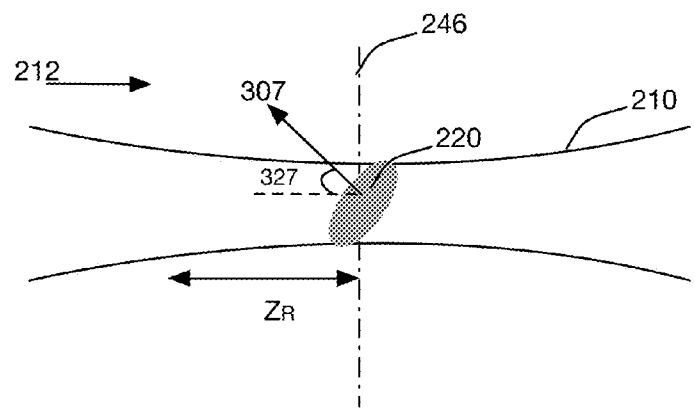
FIG. 3B
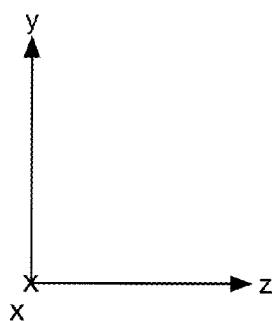

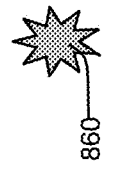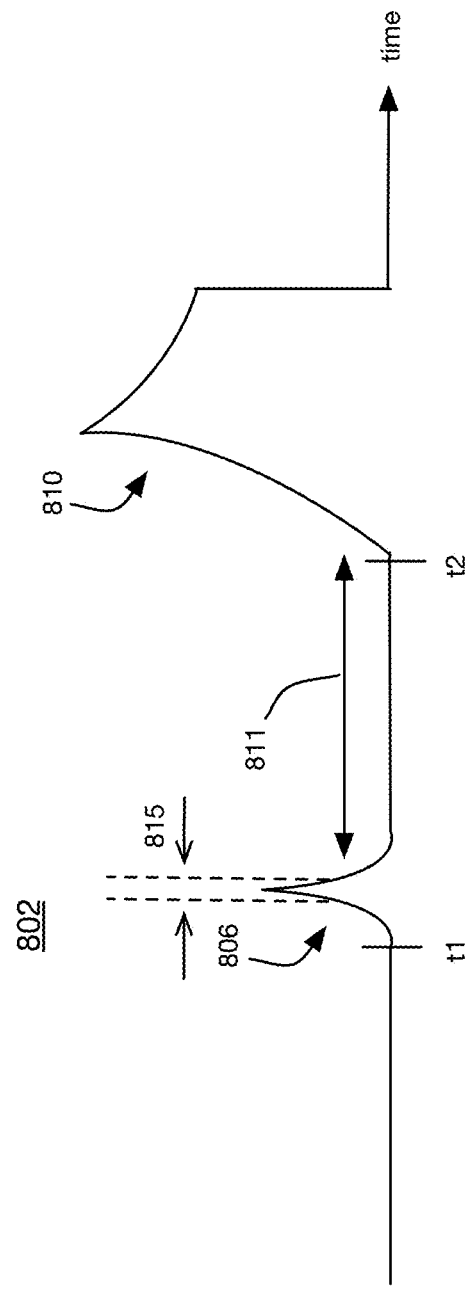
FIG. 8A
FIG. 8B

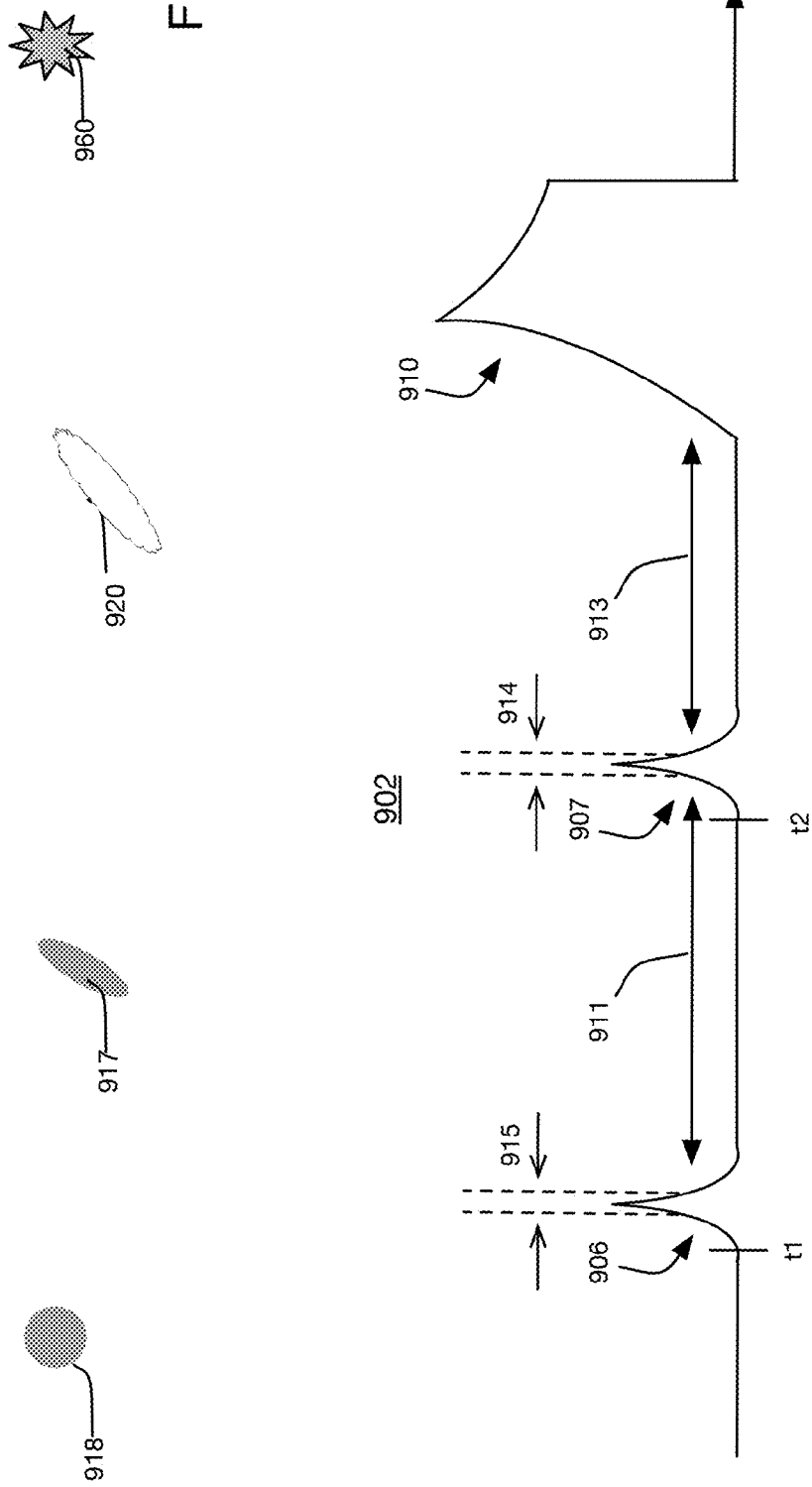

EXTREME ULTRAVIOLET LIGHT SOURCE

CROSS-REFERENCE TO RELATED APPLICATION

This application claims the benefit of U.S. Provisional Application No. 61/930,392, filed on Jan. 22, 2014 and titled EXTREME ULTRAVIOLET LIGHT SOURCE, which is incorporated herein by reference in its entirety.

TECHNICAL FIELD

The disclosed subject matter relates to an extreme ultraviolet light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In one general aspect a method of reducing back reflections in an extreme ultraviolet (EUV) light system includes providing a target material that includes a material that emits extreme ultraviolet light when converted to plasma and reflects light that propagates along a direction of propagation in a first direction; modifying a geometric distribution of the target material to form a modified target, the modified target including an optically reflective surface that reflects light that propagates along the direction of propagation in a second direction that is different from the first direction; and directing an amplified light beam from an optical source along the direction of propagation toward the reflective surface of the modified target, the amplified light beam converting at least part of the modified target material to plasma that emits EUV light and producing a reflection of the amplified light beam that travels in the second direction, to thereby direct the reflection away from the optical source.

Implementations can include one or more of the following features. The amplified light beam can be focused at a focal plane, and the modified target can be outside of the focal plane. Focusing the amplified light beam at a focal plane can include forming a beam waist of the amplified light beam in a region, and the modified target can be outside of the region. Focusing the amplified light beam at a focal plane can include forming a beam waist of the amplified light beam in a region, and the modified target can overlap the beam waist.

Providing a target material can include interacting a first beam of radiation and an instance of the target material to form the target material, the target material can occupy a volume that is larger than a volume occupied by the instance of the target material in a first dimension and smaller in a second dimension. Modifying the geometric distribution of the target material can include allowing a delay time to elapse after interacting the optical beam with the target material, the modified target moving to a target location and tilting relative to the direction of propagation during the delay time.

In some implementations, modifying the geometric distribution of the target material can include directing a first beam of radiation toward the target material along a first direction of propagation that is different from the direction of propagation of the amplified light beam, the interaction causing the target material to expand in a direction that is orthogonal to the first direction of propagation and causing the target material to tilt relative to the direction of propagation of the amplified light beam.

The modified target can include a disk shaped volume of molten metal having a substantially planar surface. The substantially planar surface can form an angle between 0 and 90 degrees with the direction of propagation. The substantially planar surface can form an angle between 35 and 45 degrees with the direction of propagation.

Modifying the geometric distribution of the target material can include interacting the target material with an optical beam to form the modified target.

In another general aspect, a method of generating extreme ultraviolet (EUV) light includes providing a target material at a target location, the target material including a material that emits extreme ultraviolet light when converted to plasma, and the target material extending in a first extent along a first direction and in a second extent along a second direction; directing an amplified light beam along a direction of propagation toward the target location; and focusing the amplified light beam in a focal plane, the amplified light beam being in focus at a location that is along the direction of propagation and overlaps with the focal plane and the amplified light beam being out of focus at a location that is along the direction of propagation and outside of the focal plane; and interacting the amplified light beam with the target material while the target material is outside of the focal plane and at a location where the amplified light beam is out of focus, the interaction between the target material converting at least part of the target material to plasma that emits EUV light.

Implementations can include one or more of the following features. The second extent of the target material can be greater than the first extent of the target material, and the second direction and the direction of propagation can form a non-zero angle.

The second direction can be between the direction of propagation and a direction that is perpendicular to the direction of propagation. The second direction can form an angle between 35 degrees and 45 degrees relative to the direction of propagation.

Providing the target material at the target location can include providing an initial target material at an initial location and allowing a time to elapse, the initial target material traveling from the initial location to the target location during the time.

Providing the target material at the target location can include providing an initial target material at an initial location, the initial target material including a central region, and at least two sides relative to the central region; and directing a first beam of radiation toward a portion of the initial target material, the portion being on only one side of the initial target material.

The target material can be generated by allowing a time to elapse after an interaction between the first beam of radiation and the initial target material, where during the elapsed time, a size of the initial target material increases in at least one dimension and decreases in at least one dimension, and the initial target material tilts relative to the direction of propagation of the first beam of radiation.

The side of the initial target material can include an outer edge of the initial target material. One side of the initial target material can be a portion of the initial target material that includes the central region of the initial target material. The initial target material can include a target material droplet.

Generating the target material can further include directing a second beam of radiation toward the target material after the first beam of radiation and before the target material is provided at the target location.

The target material can include a continuous segment of target material.

The entire target material can be outside of the focal plane.

In another general aspect, an extreme ultraviolet (EUV) light source includes a vacuum chamber that includes an initial target location that receives the first beam of radiation and a target location that receives the amplified light beam; a target material delivery system configured to provide target material to the initial target location, the target material including a material that emits EUV light when converted to plasma; a source configured to produce a first beam of radiation and an amplified light beam, the amplified light beam including an energy sufficient to convert at least part of the target material to plasma that emits EUV light; and an optical steering system configured to direct the amplified light beam toward the target location and focus the amplified light beam at a focal plane, where the first beam of radiation has an energy sufficient to cause a change in a geometric distribution of the target material to form a modified target, the target location receives the modified target, and the target location is outside of the focal plane.

Implementations can include one or more of the following features. The first beam of radiation can be at least one pulse of a pulsed laser beam, and the source can include a first laser source that produces the pulsed laser beam, and a second source, separate from the first, that produces the amplified light beam. The first pulse of radiation can propagate on the beam path.

The source can include a seed laser. The EUV light source also can include at least one optical amplifier; and an isolator between the optical amplifier and the seed laser, where the at least one optical amplifier, and the isolator are on a beam path along which the amplified light beam propagates.

Implementations of any of the techniques described above may include a target for a laser produced plasma EUV light source, an EUV light source, a method of reducing or eliminating back reflections in a drive laser used in a laser produced plasma EUV light source, a method of producing EUV light, a system for retrofitting an EUV light source, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

FIG. 2A is a side cross-sectional view of an exemplary target.

FIG. 2C is an illustration of an exemplary tilt of the target of FIG. 2A.

FIG. 2D is an illustration of another exemplary tilt of a target.

FIGS. 3A-3D are side cross-sectional views of the target of 2A interacting with an amplified light beam.

FIG. 8A shows an exemplary initial target that is converted to a target.

FIG. 8B is a plot of an exemplary waveform, shown as energy versus time, for generating the target of FIG. 8A.

FIG. 9A shows another exemplary initial target that is converted to a target.

FIG. 9B is a plot of an exemplary waveform, shown as energy versus time, for generating the target of FIG. 9A.

DESCRIPTION

Techniques for increasing the conversion efficiency of extreme ultraviolet (EUV) light production are disclosed. As discussed in more detail below, target material, or a target that includes a target material that emits EUV light when converted to plasma, is positioned relative to an oncoming amplified light beam in a manner that increases the portion of the target that is converted to plasma and emits EUV light and/or increases the overall amount of EUV light produced.

Figure 1:
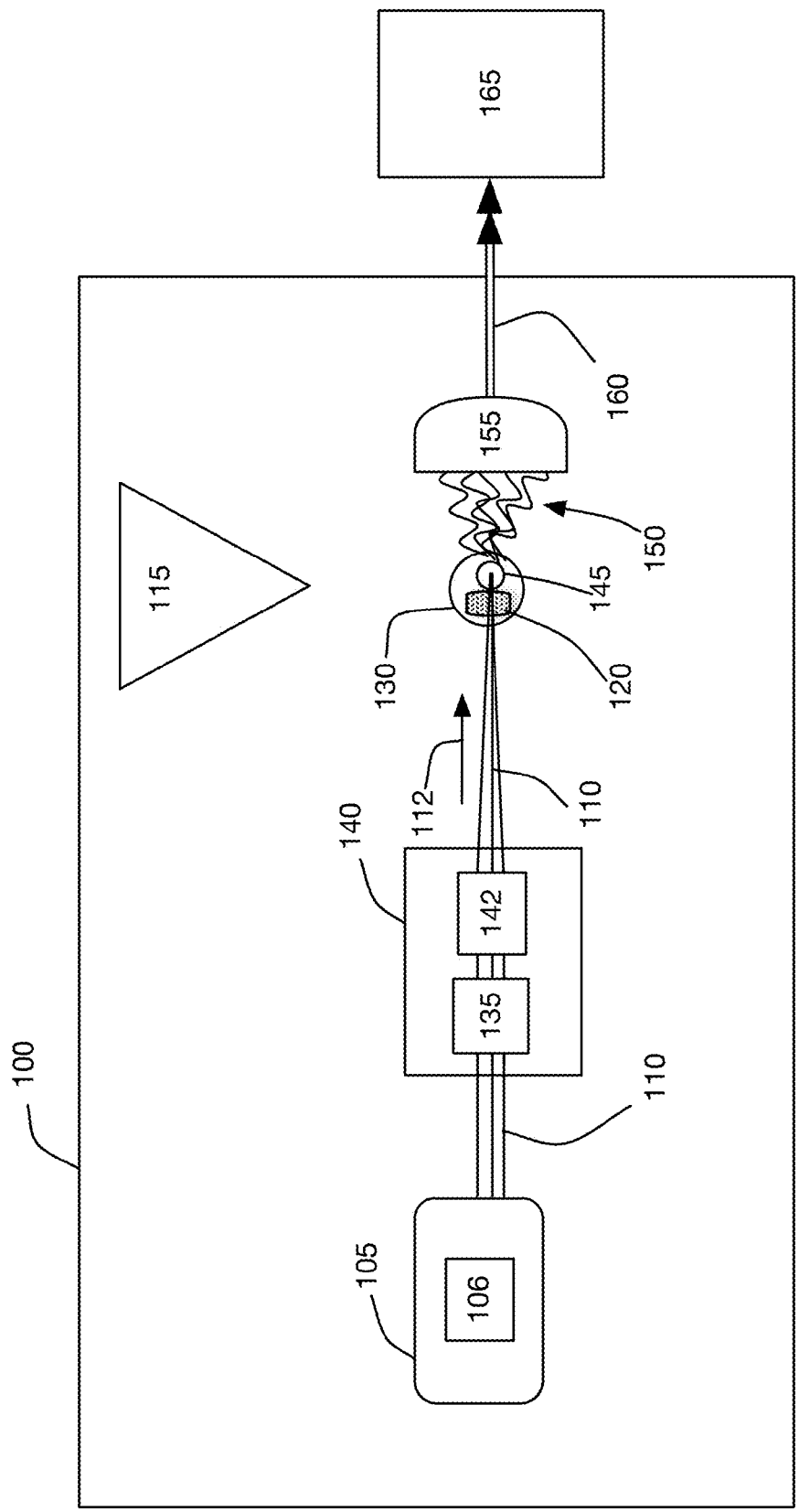
FIG. 1 is a block diagram of an exemplary laser produced plasma extreme ultraviolet light (EUV) source.

Referring to FIG. 1, an optical amplifier system 106 forms at least part of an optical source 105 (also referred to as a drive source or a drive laser) that is used to drive a laser produced plasma (LPP) extreme ultraviolet (EUV) light source 100. The optical amplifier system 106 includes at least one optical amplifier such that the optical source 105 produces an amplified light beam 110 that is provided to a target location 130. The target location 130 receives a target material 120, such as tin, from a target material supply system 115, and an interaction between the amplified light beam 110 and the target material 120 produces plasma that emits EUV light or radiation 150. A light collector 155 collects and directs the EUV light 150 as collected EUV light 160 toward an optical apparatus 165 such as a lithography tool.

The amplified light beam 110 is directed toward the target location 130 by a beam delivery system 140. The beam delivery system 140 can include optical components 135 and a focus assembly 142 that focuses the amplified light beam 110 in a focal region 145. The components 135 can include optical elements, such as lenses and/or mirrors, which direct the amplified light beam 110 by refraction and/or reflection. The components 135 also can include elements that control and/or move the components 135. For example, the components 135 can include actuators that are controllable to cause optical elements of the beam delivery system 140 to move.

The focus assembly 142 focuses the amplified light beam 110 so that the diameter of the beam 110 is at a minimum in the focal region 145. In other words, the focus assembly 142 causes the radiation in the amplified light beam 110 to converge as it propagates toward the focal region 145 in a direction 112. In the absence of a target, the radiation in the amplified light beam 110 diverges as the beam 110 propagates away from the focal region 145 in the direction 112.

As discussed below, the target 120 is positioned relative to the amplified light beam 110 and the focus assembly 142 to increase the portion of the target 120 that is converted to plasma, thereby increasing conversion efficiency and/or the amount of EUV light produced.

Additionally or alternatively, the spatial distribution of the target material 120 can be modified to increase the size of the target material 120 in a direction that intersects the amplified light beam 110. For example, the target material 120 can be expanded from a droplet into a flat disk that has a face that is perpendicular or tilted relative to the direction 112. Increasing the size of the target material 120 in this manner can increase the portion of the target material 120 that is exposed to the amplified light beam 110, increasing the amount of EUV light that is produced for a given amount of target material 120. In some implementations, the material properties of the target can be modified to increase absorption of the amplified light beam 110.

Referring to FIG. 2A, a side cross-sectional view (viewed along the direction x) of an exemplary target 220 is shown. The target 220 can be used in the system 100 as the target material 120. The target 220 is inside of a target region 230 that receives an amplified light beam 210. The target 220 includes a target material (such as, for example, tin) that emits EUV light when converted to plasma. The amplified light beam 210 has energy sufficient to convert at least a portion of the target 220 to plasma.

The exemplary target 220 is an ellipsoid (a three-dimensional ellipse). In other words, the target 220 occupies a volume that is approximately defined as the interior of a surface that is a three-dimensional analog of an ellipse. However, the target 220 can have other forms. For example, the target 220 can occupy a volume that has the shape of all or part of a sphere, or the target 220 can occupy an arbitrarily shaped volume, such as a cloud-like form that does not have well-defined edges. For a target 220 that lacks well-defined edges, a volume that contains, for example, 90%, 95% or more of the material that makes up the target can be treated as the target 220. The target 220 can be asymmetric.

Additionally, the target 220 can have any spatial distribution of target material and can include non-target material. The target 220 can be a system of particles and/or pieces, an extended object that is essentially a continuous and homogenous material, a collection of particles, a pre-plasma that includes ions and/or electrons, a spatial distribution of material that includes continuous segments of molten metal, pre-plasma, and particles, and/or a segment of molten metal. The contents of the target 220 can have any spatial distribution. For example, the target 220 can be homogeneous in one or more directions. In some implementations, the contents of the target 220 are concentrated in a particular portion of the target 220 and the target has a non-uniform distribution of mass.

The side cross-section of the target 220 shown in FIG. 2A is an ellipse with a major axis, which has a length equal to the largest distance that spans the entire ellipse, and a minor axis, which is perpendicular to the major axis. The target 220 has a first extent 222 that extends along a direction 221, and a second extent 224 that extends along a direction 223 that is perpendicular to the direction 221. For the example target 220, the extent 222 and the direction 221 are the length and direction of the minor axis, and the extent 224 and the direction 223 are the length and direction of the major axis.

Figure 2B:
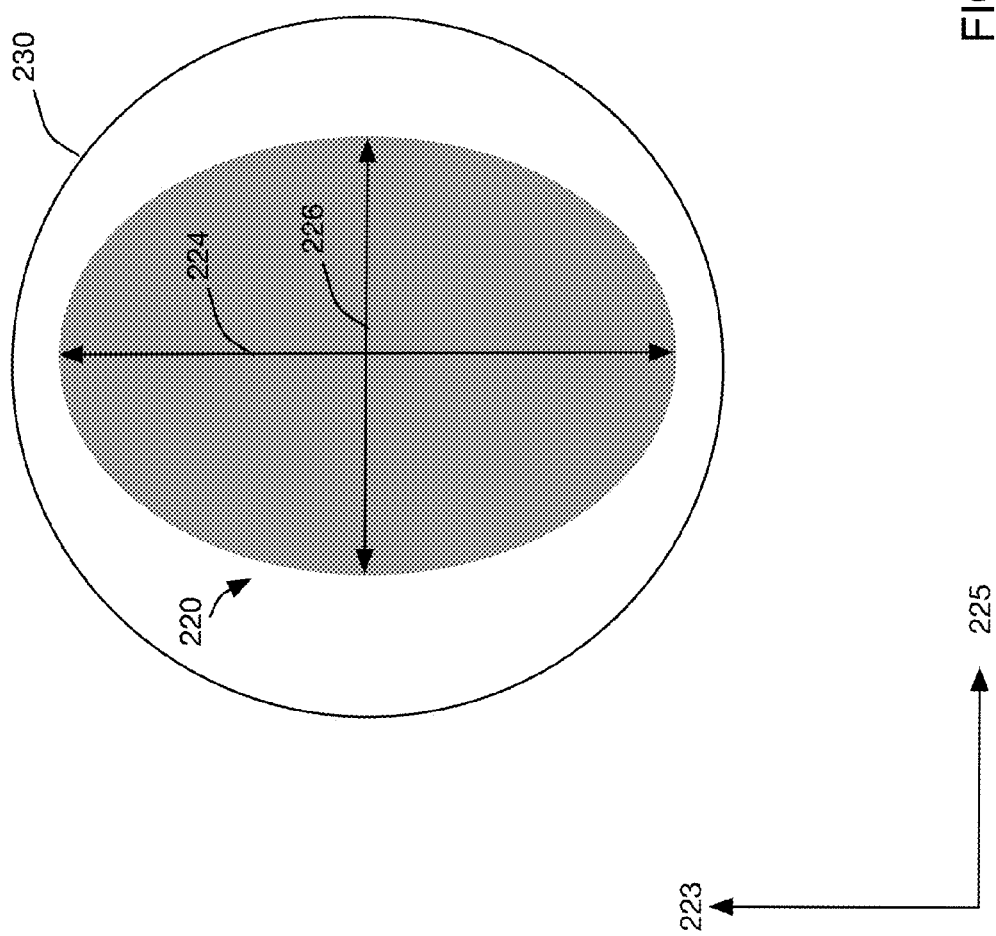
FIG. 2B is a front cross-sectional view of the target of FIG. 2A.

Referring also to FIG. 2B, a front cross-sectional view of the target 220, looking in the direction 221, is shown. The target 220 has an elliptically shaped front cross-section with the major axis extending in the direction 223 and having the extent 224. The front cross-section of the target 220 has an extent 226 in a third dimension in a direction 225. The direction 225 is perpendicular to the directions 221 and 223.

Referring to FIG. 2A, the extent 224 of the target 220 is tilted relative to the direction 212 of propagation of the amplified light beam 210. Referring also to FIG. 2C, the direction 223 of the extent 224 forms an angle 227 with the direction 212 of propagation of the amplified light beam 210. The angle 227 is measured relative to the amplified light beam 210 as it travels in the direction 212 and impinges on the target 220. The angle 227 can be 0-90 degrees. In FIGS. 2A and 2C, the target 220 is tilted toward the amplified light beam 210. In examples in which the target 220 is tilted away from the amplified light beam 210, such as shown schematically in FIG. 2D, the angle 227 is between 0 and −90 degrees.

As discussed above, the target 220 can have other forms besides an ellipsoid. For targets that occupy a volume, the shape of the target can be considered to be a three-dimensional form. The form can be described with the three extents 222, 224, 226, which extend along the three mutually orthogonal directions 221, 223, 225, respectively. The lengths of the extents 222, 224, 226 can be the longest length across the form, from one edge of the form to an edge on another side of the form, in a particular direction that corresponds to one of the directions 221, 223, 225. The extents 222, 224, 226 and the directions 221, 223, 225 can be determined or estimated from visual inspection of the target 220. Visual inspection of the target 220 can occur by, for example, imaging the target 220 as it leaves the target material delivery system 115 and travels to the target location 130 (FIG. 1).

In some implementations, the directions 221, 223, 225 can be considered to be mutually orthogonal axes that pass through the center of mass of the target 220 and correspond to the principal axes of inertia for the target 220. The center of mass of the target 220 is the point in space where the relative position of the mass of the target 220 is zero. In other words, the center of mass is the average position of the material that makes up the target 220. The center of mass does not necessary coincide with the geometric center of the target 220, but can when the target is a homogenous and symmetric volume.

The center of mass of the target 220 can be expressed as a function of products of inertia, which are a measure of imbalance of the spatial distribution of mass in the target 220. The products of inertia can be expressed as a matrix or a tensor. For a three-dimensional object, three mutually orthogonal axes that pass through the center of mass exist for which the products of inertia are zero. That is, the product of inertia lies along a direction in which the mass is equally balanced on either side of a vector that extends along that direction. The directions of the products of inertia can be referred to as the principal axes of inertia of the three-dimensional object. The directions 221, 223, 225 can be the principal axes of inertia for the target 220. In this implementation, the directions 221, 223, 225 are the eigenvectors of the inertial tensor or matrix of the products of inertia for the target 220. The extents 222, 224, 226 can be determined from the eigenvalues of the inertial tensor or matrix of the products of inertia.

In some implementations, the target 220 can be approximately regarded as a two-dimensional object. When the target 220 is two-dimensional, the target 220 can be modeled with two orthogonal principal axes and two extents along the directions of the principal axes. Alternatively or additionally, as for a three-dimensional target the extents and directions for a two-dimensional target can be determined through visual inspection.

Referring to FIGS. 3A-3D, side views (viewed along the direction x) of the target material 220 being irradiated by the amplified light beam 210 are shown. The amplified light beam 210 propagates along a direction 212 and is focused at a focal plane 246 that is perpendicular to the direction 212. The amplified light beam 210 has a beam diameter "d" at the focal plane 246. In this example, the beam diameter "d" and the area of the cross-section of the amplified light beam 210 are at a minimum at the focal plane 246, and the irradiance (power per unit area) of the amplified light beam 110 is at a maximum at the plane 246.

The amplified light beam 210 can be approximated as a Gaussian beam that has a beam diameter with a radius "w" that is at a minimum and forms a beam waist "$w_0$" at the plane 246. The amplified light beam 210 can be approximated to have a depth of focus "b", which is given by equation (1):

$$b = 2Z_R = 2\left(\frac{\pi w_0^2}{\lambda}\right),\qquad(1)$$

where $\lambda$ is the wavelength of the amplified light beam 210, and the quantity $Z_R$ is the Rayleigh range.

In the example shown in FIG. 3A, the target 220 is positioned with the extent 224 perpendicular to the direction 212 and coincident with the plane 246. In other words, the target 220 is at the focus of the amplified light beam 210. When the amplified light beam 210 interacts with the target 220, a portion of the target 220 is converted to plasma and a reflection 301 is produced. The reflection 301 can be a reflection of the amplified light beam 210 from the target 220 and/or a reflection from the plasma created by irradiating the target 220. The reflection 301 propagates away from the target 220 in a direction that is opposite to the direction 212. Because the target 220 is at the focal plane 246 with the extent 224 perpendicular to the direction 212, the reflection 301 traces the path that the amplified light beam 210 followed to reach the target 220 and thus can be directed back into the optical amplifier system 106.

In the example shown in FIG. 3B, the target 220 is tilted relative to the direction 212, with the direction 223 of the extent 224 forming an angle 327 with the direction 212. The target 220 is tilted when it is positioned, moved, or caused to move into a sloping position relative to the direction of propagation 212. A portion of the target 220 coincides with the focal plane 246, and the target 220 is within the depth of focus b. When the amplified light beam 210 interacts with the target 220, a portion of the target 220 is converted to plasma and a reflection 307 is produced. The reflection 307 propagates away from the target 220 at the angle 327 relative to the direction 212. Thus, the reflection 307 propagates away from the target 220 in a direction that is different than the direction of the reflection 301 and is thus less likely to be directed back into the optical amplifier system 106.

In addition to changing the direction of the reflected amplified light beam 210, tilting the target 220 causes more of the target 220 to be exposed to the amplified light beam 210 as compared to orienting the target 220 at the focal plane 246 and normal to the oncoming amplified light beam 210. For example, the tilting of the target 220 causes target portions 310a and 310b, which are outside of the amplified light beam 210 in the arrangement shown in FIG. 3A, to be in the path of the amplified light beam 210.

Furthermore, in some implementations, tilting the target 220 relative to the direction of propagation of the amplified light beam 210 can expose the amplified light beam 210 to a part of the target 220 that has a more favorable density profile than when the extent 224 is perpendicular to the direction 212. In some targets (such as the target 920 discussed with respect to FIGS. 9A-9C), the density profile increases along the extent 222. A lower density material more readily converts to plasma. When a target that has a density that increases along the extent 222 is tilted relative to the direction 212, the volume of low-density material that is exposed to the amplified light beam 210 is increased, resulting in a larger portion of the target being converted to plasma and emitting EUV light.

Figure 3C:
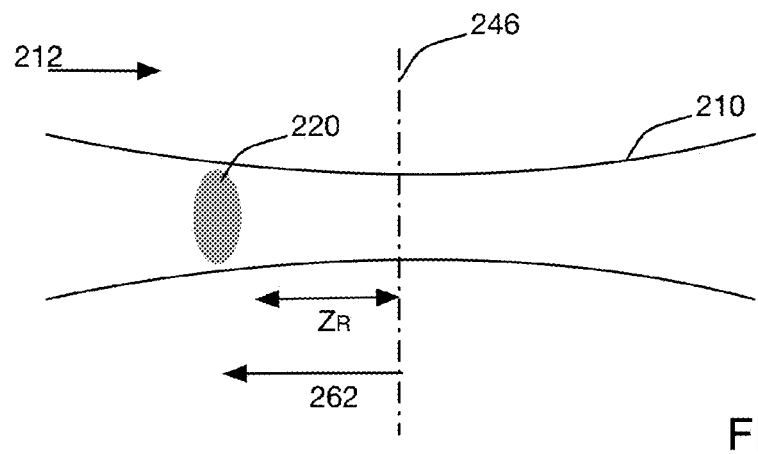
Figure 3D:
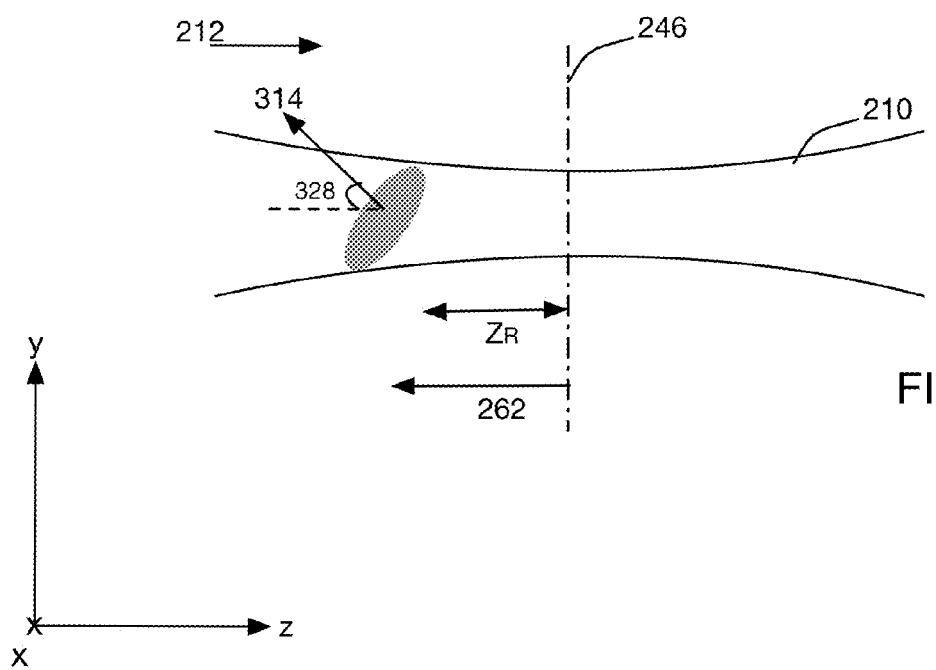

Referring to FIGS. 3C and 3D, the target 220 can also be placed a distance 262 from the focal plane 246. The distance 262 extends from the focal plane 246 in the direction 212 or in a direction that is opposite from the direction 212. In other words, the target 220 can be placed upstream of the focal plane 246 (as shown in FIGS. 3C and 3D) or downstream from the focal plane 246. The distance 262 can be such that none of the target 220 coincides with the focal plane 246. In some implementations, some or the entire target 220 can be outside of the depth of focus b. The distance 262 can be, for example, 2-3 times the Rayleigh range ($Z_R$) of the amplified light beam 110 as approximated as a Gaussian beam. In some examples, the distance 262 can be 1 millimeter (mm) or greater.

As discussed above, the amplified light beam 210 converges while propagating from the focus assembly 242 to the focal plane 246. Thus, more of the target 220 is exposed to the amplified light beam 210 when the target 220 is placed at the distance 262 from the focal plane 246. Additionally, when the target 220 is placed away from the focal plane 246, reflections of the amplified light beam 110 from the target 220 are not imaged back along the same path on which the amplified light beam 210 propagates because the reflections propagate in a different manner through the focus assembly 242.

FIG. 3D shows the target 220 placed the distance 262 from the focal plane 246 with the extent 224 tilted at an angle 328 relative to the direction 212. Tilting the target 220 relative to the direction 212 of propagation of the amplified light beam 210 also directs a reflection 314 of the amplified light beam 210 away from the path along which the amplified light beam 210 propagates.

Thus, although the highest irradiance (power per unit area) on the target 220 occurs when the target is at the focal plane 246, which would typically be expected to lead to maximization of conversion of the target 220 into plasma, positioning the target 220 outside of the focal plane 246 and/or with the extent 224 at an angle relative to the amplified light beam 210, can convert a greater portion of the target 220 to plasma by exposing more of the target 220 to the amplified light beam 210. Additionally, and as discussed in FIGS. 4A-4D, 5, and 6, tilting and/or placing the target 220 away from the focal plane 246 also directs reflections away from an optical source, such as the optical source 105, of the amplified light beam 210, which can result in the optical source producing more power.

FIGS. 4A-4D are a block diagram of an exemplary system 400 that produces an amplified light beam 410 that irradiates the target 220. The system includes an optical source (or drive laser system) 405 that produces the amplified light beam 410 and a focusing optic 442. The amplified light beam 410 propagates in a direction 412 and is focused by the focusing optic 442 to a focal plane 446.

FIGS. 4A-4D show different orientations and positions of the target 220 relative to the focal plane 446 and the direction 412. The orientation and/or position of the target 220 affect the amount of reflections that enter the optical source 405. In particular, tilting and/or moving the target 220 away from the focal plane 446 can increase the amount of power produced by the system 400, thus delivering more power to the target 220. More power on the target 220 can cause a corresponding increase in the amount of generated EUV light.

In this example, the optical source 405 includes a light generator 402 and an optical amplifier system 406 including a "chain" of two optical amplifiers 406a, 406b. The light generator 402 can be, for example, a laser, a seed laser such as a master oscillator, or a lamp. The optical amplifiers 406a, 406b contain a gain medium (not shown) on a beam path 407, along which a light beam 408 from the light generator 402 propagates. When the gain medium is excited, the gain medium provides photons to the light beam 408, amplifying the light beam 408 to produce the amplified light beam 410.

The optical source 405 also includes an isolator 409. The isolator 409 can be a spatial filter or other geometric type filter, such as a pinhole that has an aperture centered on the beam path 407. The pinhole blocks light that is outside of the aperture. Because this type of isolator only passes light that falls within the aperture, it has as its criteria for passing or rejecting light the angle at which the light propagates (for example the angle at which the backwards reflection propagates). As a result, tilting the target 200 to angle the backwards reflection and/or moving the target 220 away from the focal plane to change the angle of the backwards reflections after they are collected by the focusing optic 442 can provide a technique that takes advantage of the strengths of this type isolator.

The isolator 409 can help to isolate or protect the amplifier 406a and the light generator 402 from reflections emanating from the target location 430. Although the exemplary optical source 405 shown in FIGS. 4A-4D includes two amplifiers 406a, 406b, with the isolator 409 positioned on the beam path 407 between the two amplifiers 406a, 406b, other implementations can include different configurations. For example, the optical source 405 can include fewer or more optical amplifiers and/or additional isolators. The isolators can be placed on the beam path 407 among the amplifiers and the light generator 402 in any arrangement.

Figure 4A:
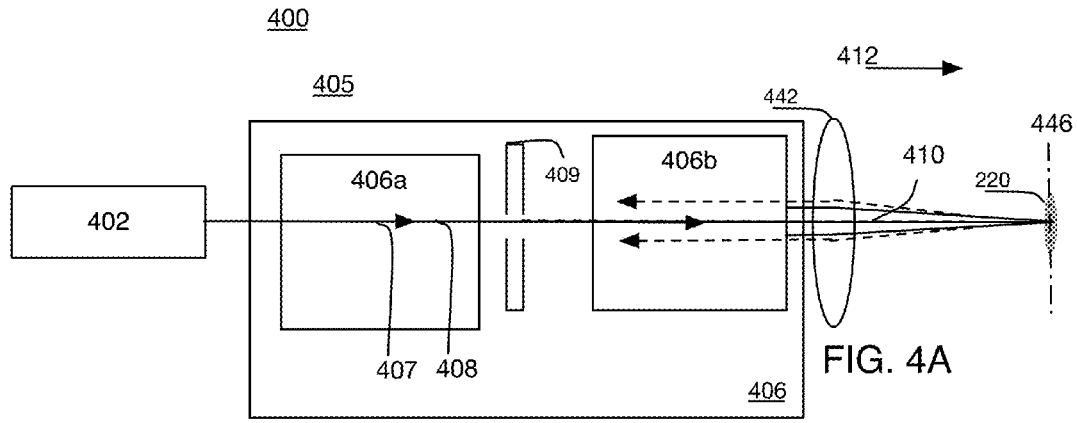
FIGS. 4A-4D are block diagrams of an exemplary optical source for an EUV system.

In the arrangement shown in FIG. 4A, the target 220 is placed with the extent 224 coincident with the focal plane 446. Because the target 220 is at the focal point of the amplified light beam 410, the target 220 and/or the produced plasma reflects the amplified light beam 410 back along the path followed by the amplified light beam 410, the reflection is collimated by the focusing optic 442 and enters the amplifier 406b where the reflection can become amplified by the gain medium. The reflection is shown with a dashed line and can be referred to as a "backward-going" beam, because it travels in the optical source 405 in a direction that is generally opposite of the direction in which the light beam 408 travels.

The reflection travels back into the optical source 405 until reaching an aperture or filter that blocks further propagation. Because the reflection propagates along the beam path 407, the reflection can reach and possibly pass through the isolator 409, and enter the amplifier 406a and the light generator 402. The amplified reflection extracts energy stored in the gain medium of the amplifiers 405 and reduce the amount of photons that the gain media in the optical amplifiers 406a, 406b can provide to subsequent forward-going light beams. In some cases, the backwards-propagating energy can exceed the damage threshold of the optical materials in the first part of the optical amplifier chain (for example, components in or in the vicinity of the amplifier 406a) and damage components there. In this manner, the reflection can reduce the power output of the optical source 405.

Figure 4B:
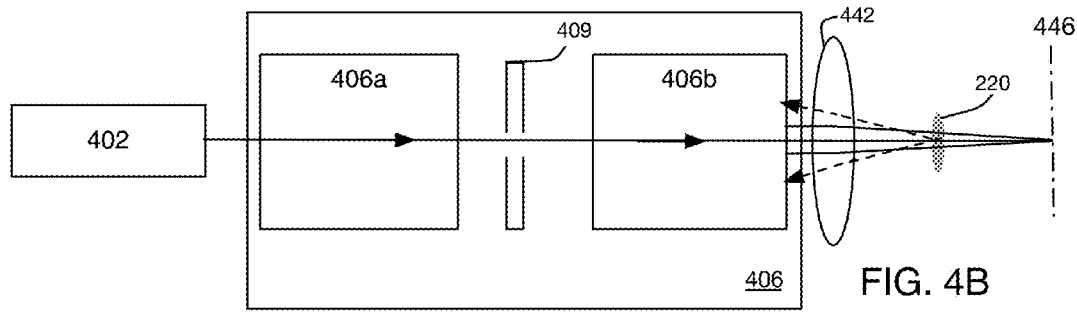

Referring to FIG. 4B, the target 220 is positioned away from the focal plane 446, between the focal plane 446 and the focusing optics 442, with the extent 224 oriented perpendicular to the direction of propagation of the amplified light beam 410. In this arrangement, reflections from the target 220 do not follow the path that the amplified light beam 410 followed to reach the target. Instead, the reflection continues to converge and then diverges after reaching a minimum. Although some of the reflection can enter the focusing optic 442, the amount that enters can be less than the scenario shown in FIG. 4A. Furthermore, the portions of the reflection that enter the focusing optic 442 are not entering the focusing optic 442 at an angle such that would cause the focusing optic 442 to collimate the reflection and direct the reflection onto the beam path 407. Additionally, because the reflection does not travel precisely along the beam path 407, apertures and filters that do not block the forward-going beam 408 can block the reflection, further reducing the amount of the reflection that reaches the components of the light source 405.

Figure 4C:
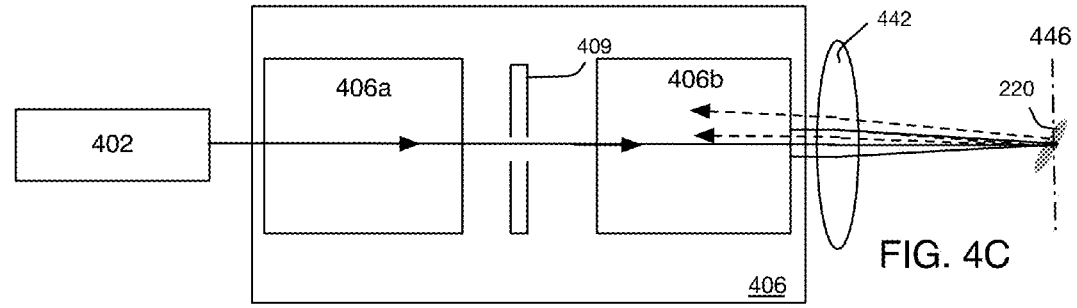

Referring to FIG. 4C, the target 220 is positioned to partially coincide with the focal plane 446, and the extent 224 makes an angle with the direction of propagation of the amplified light beam 410. The amplified light beam 410 irradiates the target 220 and produces plasma and a reflection. The reflection propagates away from the target 220 at the angle. Thus, the reflection does not follow the path that the amplified light beam 410 followed. As compared to the case shown in FIG. 4A, less of the reflected light enters the amplifier 406b. In some implementations, no reflected light enters the amplifier 406b.

Figure 4D:
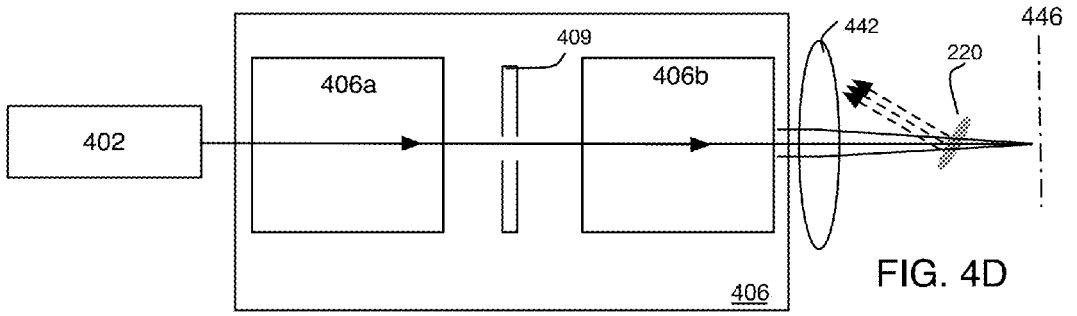

FIG. 4D shows an example in which the target 220 is tilted relative to the direction of propagation of the amplified light beam 410 and positioned between the focusing optic 442 and the focal plane 446. A reflection made from an interaction of the amplified light beam 410 and the target 220 propagates at the angle relative to a direction that is opposite the direction 412. As a result, little or none of the reflection enters the light source 405.

Figure 5:
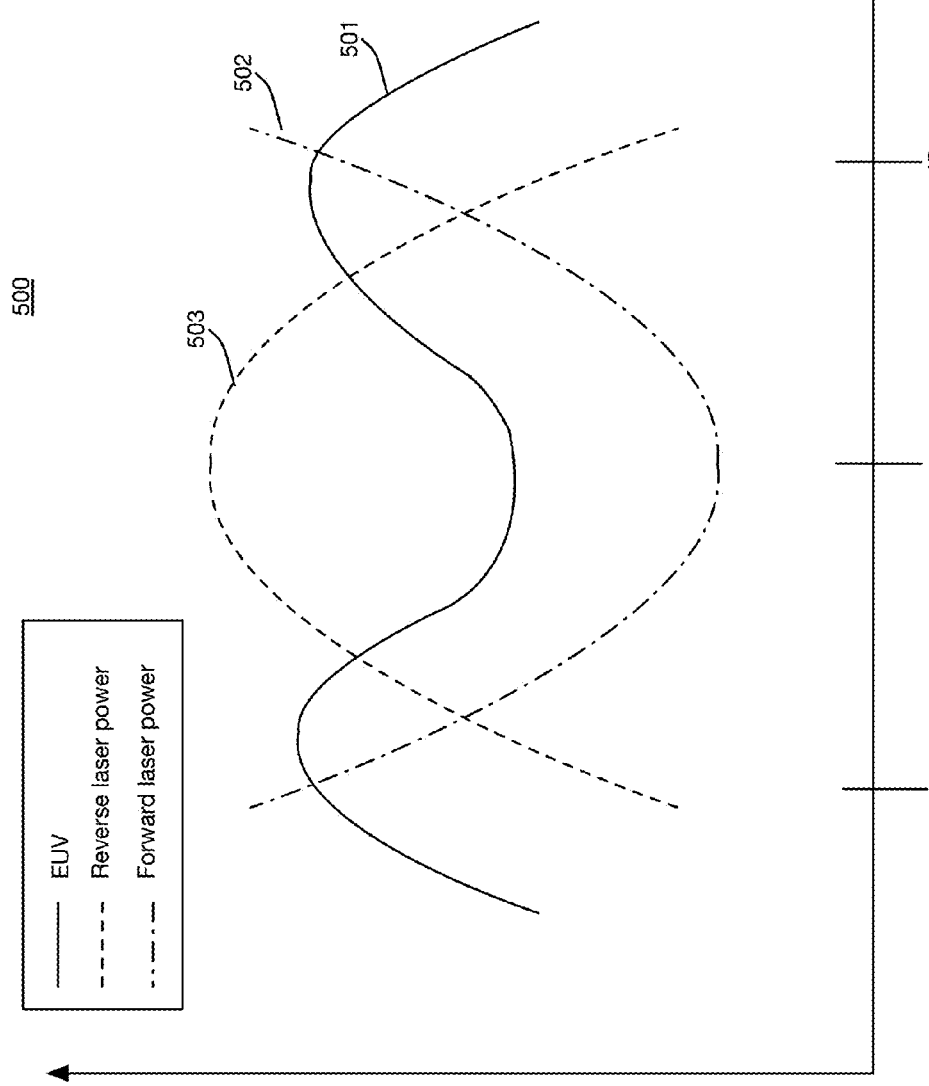
FIG. 5 is an exemplary plot of power as a function of target tilt.

FIG. 5 is a plot 500 of an exemplary relationship between power and target angle for a target that is positioned at a focus of an amplified light beam. The target angle is the angle between the extent 224 relative to the direction 212 of propagation of the amplified light beam 210. Although other targets can be used to produce data for a plot similar to the plot 500, FIG. 5 is discussed with respect to the system 400 shown in FIGS. 4A-4D.

The plot 500 includes curves 501, 502, 503. The curve 501 represents the amount of EUV power produced when the amplified light beam 410 irradiates the target 220. The curve 502 represents the power of the amplified light beam 410, measured as the amplified light beam travels toward the target 220. The curve 503 represents the power of the power of a reverse-going beam that arises from the target 220 reflecting the amplified light beam 410.

The produced EUV power has maxima when the target 220 is tilted about +/−35-45 degrees relative to the direction of propagation of the amplified light beam 410. In some implementations, the produced EUV power has maxima when the target 220 is tilted about +/−25-45 degrees relative to the direction of propagation of the amplified light beam 410. The produced EUV power has a minima at 0 degree tilt angle (an example of such a position is shown in FIG. 4A). The power of the reverse-going beam is maximum when the target 220 is positioned with at 0 degree tilt angle. This is because the amount of the reflected amplified light beam that enters the optical amplifier system 406 is greatest when the target 220 is arranged with the extent 224 perpendicular to the direction of propagation of the amplified light beam 210. Additionally, the power of the forward beam (the amplified light beam 210) is at a minimum when the target tilt angle is 0 degrees.

As discussed above, the reverse-going beam can deplete the gain media of the optical amplifiers 406a, 406b that produce the amplified light beam 410, which in turn leads to a reduction in power of the amplified light beam 410. Thus, the power of the forward-going beam (the amplified light beam 410) has a maximum when the power of the backward-going beam has a minimum. The EUV power has a maximum when the amplified light beam 410 has a maximum because of the additional power available to convert the target 220 into plasma that emits EUV.

Figure 6:
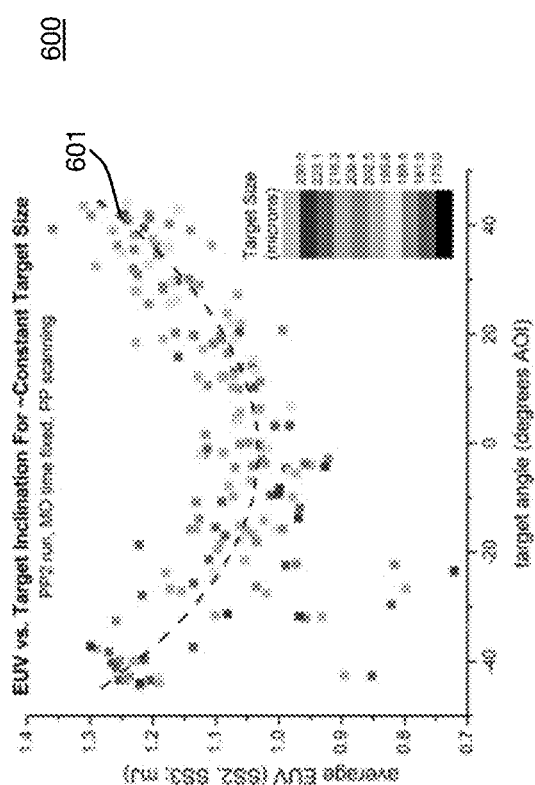
FIG. 6 is an exemplary plot of energy as a function of target tilt.

FIG. 6 shows a graph 600 of experimentally measured EUV power as a function of target angle. To obtain the data shown in the graph 600, sensors sensitive to EUV light were arranged to collect EUV light emitted from a plasma generated from a target (such as the target 220), and the outputs of the sensors were averaged to determine a measured EUV power value. The sensors were arranged in the direction of the target inclination to minimize the effects of "searchlighting." Searchlighting can occur when the plasma produced from the target 220 emits more EUV light toward sensors that are more responsive while emitting less or no EUV light toward sensors that have lower responsivity.

The target sizes were between 178 and 236 microns (μm). The targets were tilted between 0 and about +/−−40 degrees relative to the direction of propagation of the amplified light beam. In the example shown, the targets were tilted using a pre-pulse light beam that struck an initial target before the main pulse. The angle of tilting was determined by the time between the pre-pulse and the amplified light beam, with greater tilt angles being achieved as the time between the pre-pulse and the amplified light beam increased. The amplified light beam had the same parameters (direction of propagation, energy, wavelength) for each tilt angle and target size. A curve 601 was fit to the collected data. The curve 601 shows that 20-25% more EUV light is produced from a tilted target than from a normal incidence target.

Figure 7:
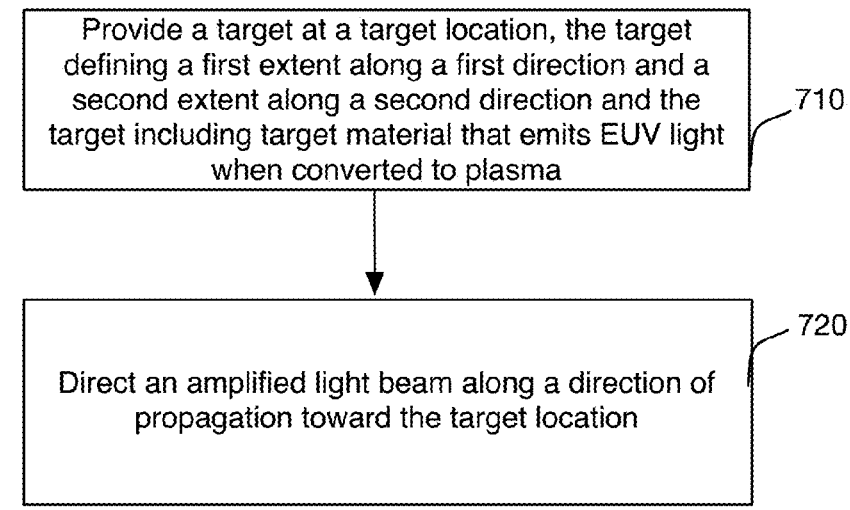
FIG. 7 is a flow chart of an exemplary process for producing EUV light.

Referring to FIG. 7, a flow chart of an exemplary process 700 for generating EUV light is shown. The process 700 can also be used to position a target 120 relative to an optical source 105 to reduce back reflections into the optical source 105. The target 120 is provided at the target location 130 (710). The target has a first extent along a first direction and a second extent along a second direction. The target includes target material that emits EUV light when converted to plasma. An amplified light beam is directed along a direction of propagation toward the target location (720).

FIGS. 8A-8C, 9A-9C, and 10 show examples of providing a target at a target location (710), and directing an amplified light beam toward the target location (720). FIG. 11 shows an example system configuration for implementations that employ a pre-pulse as part of the target formation.

Figure 8C:
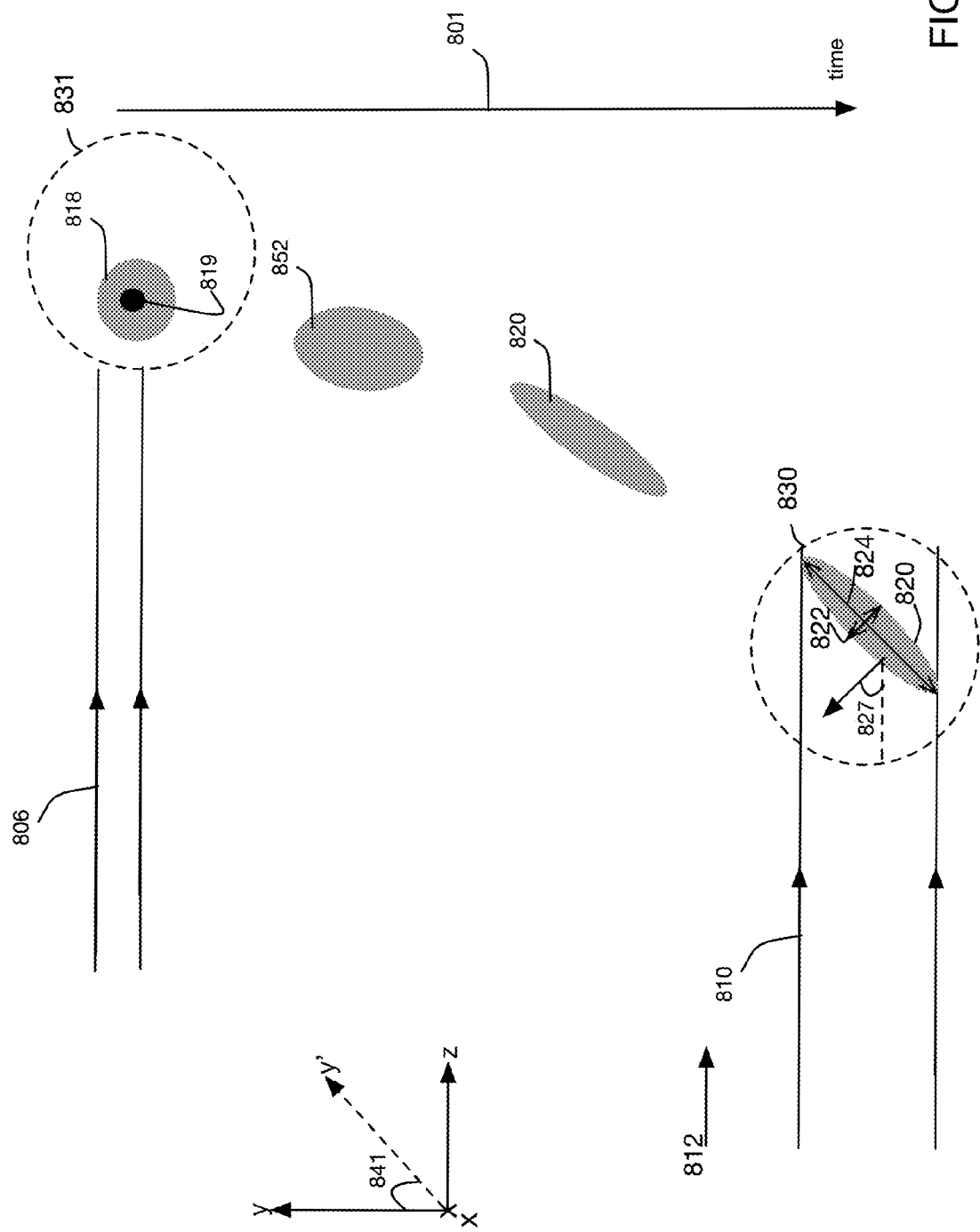
FIG. 8C shows side views of the initial target and the target of FIG. 8A.

FIGS. 8A-8C show an example of providing a target 820 to a target location 830. Referring to FIGS. 8A and 8B, an exemplary waveform 802 transforms an initial target 818 into a target 820. The initial target 818 and the target 820 include target material that emits EUV light 860 when converted to plasma through irradiation with an amplified light beam 810 (FIG. 8C).

The target material can be a target mixture that includes a target substance and impurities such as non-target particles. The target substance is the substance that is converted to a plasma state that has an emission line in the EUV range. The target substance can be, for example, a droplet of liquid or molten metal, a portion of a liquid stream, solid particles or clusters, solid particles contained within liquid droplets, a foam of target material, or solid particles contained within a portion of a liquid stream. The target substance can be, for example, water, tin, lithium, xenon, or any material that, when converted to a plasma state, has an emission line in the EUV range. For example, the target substance can be the element tin, which can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. Moreover, in the situation in which there are no impurities, the target material includes only the target substance. The discussion below provides an example in which the initial target 818 is a droplet made of molten metal. However, the initial target 818 can take other forms.

FIGS. 8A and 8C show a time period 801 during which the initial target 818 physically transforms into the target 820 and then emits EUV light 860. The initial target 818 is transformed through interaction with the radiation delivered in time according to the waveform 802. FIG. 8B is a plot of the energy in the waveform 802 as a function of time over the time period of FIG. 8A. As compared to the initial target 818, the target 820 has a side cross section with an extent that is greater in the "y" direction, and is less in the "z" direction. Additionally, the target 820 is tilted relative to the "z" direction (the direction 812 of propagation of the amplified beam 810 that converts at least part of the target 820 to plasma).

The waveform 802 includes a representation of a pulse of radiation 806 (a pre-pulse 806). The pre-pulse 806 can be any type of pulsed radiation that has sufficient energy to act on the initial target 818, but the pre-pulse 806 does not convert the target material to plasma. The force of the impact of the first pre-pulse 806 can deform the initial target 818 into a shape that is closer to a disk that expands, after about 1-3 microseconds (μs), into a disk shaped piece of molten metal. The amplified light beam 810 can be referred to as the main beam or the main pulse. The amplified light beam 810 has sufficient energy to convert target material in the target 820 to plasma that emits EUV light.

The pre-pulse 806 and the amplified light beam 810 are separated in time by a delay time 811, with the amplified light beam 810 occurring at time $t_2$, which is after the pre-pulse 806. The pre-pulse 806 occurs at a time $t=t_1$ and has a pulse duration 815. The pulse duration can be represented by the full width at half maximum, the amount of time that the pulse has an intensity that is at least half of the maximum intensity of the pulse. However, other metrics can be used to determine the pulse duration.

Before discussing the technique of providing the target 820 to the target location 830, a discussion of the interactions of the pulses of radiation, including the pre-pulse 806, with the initial target 818 is provided.

When a laser pulse impinges (strikes) a metallic target material droplet, the leading edge of the pulse sees (interacts with) a surface of the droplet that is a reflective metal. The initial target 818 reflects most of the energy in the leading edge of the pulse and absorbs little. The small amount that is absorbed heats the surface of the droplet, evaporating and ablating the surface. The target material that is evaporated from the surface of the droplet forms a cloud of electrons and ions close to the surface. As the pulse of radiation continues to impinge on the target material droplet, the electric field of the laser pulse can cause the electrons in the cloud to move. The moving electrons collide with nearby ions, heating the ions through the transfer of kinetic energy at a rate that is roughly proportional to the product of the densities of the electrons and the ions in the cloud. Through the combination of the moving electrons striking the ions and the heating of the ions, the cloud absorbs the pulse.

As the cloud is exposed to the later parts of the laser pulse, the electrons in the cloud continue to move and collide with ions, and the ions in the cloud continue to heat. The electrons spread out and transfer heat to the surface of the target material droplet (or bulk material that underlies the cloud), further evaporating the surface of the target material droplet. The electron density in the cloud increases in the portion of the cloud that is closest to the surface of the target material droplet. The cloud can reach a point where the density of electrons increases such that the portions of the cloud reflect the laser pulse instead of absorbing it.

Referring also to FIG. 8C, the initial target 818 is provided at an initial target location 831. The initial target 818 can be provided at the initial target location 831 by, for example, releasing target material from the target material delivery system 115 (FIG. 1). In the example shown, the pre-pulse 806 strikes the initial target 818, transforms the initial target 818, and the transformed initial target drifts into the target location 830 over time.

The force of the pre-pulse 806 on the initial target 818 causes the initial target 818 to physically transform into a geometric distribution 852 of target material. The geometric distribution 852 can be a material that is not ionized (a material that is not a plasma). The geometric distribution 852 can be, for example, a disk of liquid or molten metal, a continuous segment of target material that does not have voids or substantial gaps, a mist of micro- or nano-particles, or a cloud of atomic vapor. The geometric distribution 852 further expands during the delay time 811 and becomes the target 820. Spreading the initial target 818 can have three effects.

First, as compared to the initial target 818, the target 820 generated by the interaction with the pre-pulse 806 has a form that presents a larger area to an oncoming pulse of radiation (such as the amplified light beam 810). The target 820 has a cross-sectional diameter in the "y" direction that is larger than the cross-sectional diameter in the "y" direction of the initial target 818. Additionally, the target 820 can have a thickness that is thinner in a direction of propagation (812 or "z") of the amplified light beam 810 than the initial target 818. The relative thinness of the target 820 allows the amplified light beam 810 to irradiate more of the target material that is in the target 818.

Second, spreading the initial target 818 out in space can minimize the occurrence of regions of excessively high material density during heating of the plasma by the amplified light beam 810. Such regions of excessively high material density can block generated EUV light. If the plasma density is high throughout a region that is irradiated with a laser pulse, absorption of the laser pulse is limited to the portions of the region that receives the laser pulse first. Heat generated by this absorption may be too distant from the bulk target material to maintain the process of evaporating and heating of the target material surface long enough to utilize (evaporate) a meaningful amount of the bulk target material during the finite duration of the amplified light beam 810.

In instances where the region has a high electron density, the light pulse only penetrates a fraction of the way into the region before reaching a "critical surface" where the electron density is so high that the light pulse is reflected. The light pulse cannot travel into those portions of the region and little EUV light is generated from target material in those regions. The region of high plasma density can also block EUV light that is emitted from the portions of the region that do emit EUV light. Consequently, the total amount of EUV light that is emitted from the region is less than it would be if the region lacked the portions of high plasma density. As such, spreading the initial target 818 into the larger volume of the target 820 means that an incident light beam reaches more of the material in the target 820 before being reflected. This can increase the amount of EUV light produced.

Third, the interaction of the pre-pulse 806 and the initial target 818 causes the target 820 to arrive at the target location 830 tilted at an angle 827 with respect to the direction of propagation of the amplified light beam 810. The pre-pulse 806 has a beam width 807 when it intersects the initial target 818. The initial target 818 has a center of mass 819, and the pre-pulse 806 strikes the initial target 818 such that the majority of the energy in the pre-pulse 806 falls on one side of the center of mass 819. The pre-pulse 806 applies a force to the initial target 818, and, because the force is on one side of the center of mass 819, the initial target 818 expands along a different set of axes than the target would if the pre-pulse 806 struck the initial target 818 at the center of mass 819. The initial target 818 flattens along the direction from which it is hit by the pre-pulse 806. Thus, striking the initial target 818 off-center or away from the center of mass 819 produces a tilt. For example, when the pre-pulse 806 interacts with the initial target 818 away from the center of mass 819, the initial target 818 does not expand along the y axis and instead expands along an axis y', which is tilted at an angle 841 relative to the y axis while moving toward the target location 830. Thus, after the time period has elapsed, the initial target 818 has transformed into the target 820, which occupies an expanded volume and is tilted at the angle 827 with respect to the direction of propagation of the amplified light beam 810.

FIG. 8C shows a side cross-section of the target 820. The target 820 has an extent 822 along a direction 821 and an extent 824 along a direction 823, which is orthogonal to the direction 821. The extent 824 is greater than the extent 822, and the extent 824 forms the angle 827 with the direction 812 of propagation of the amplified light beam 810. The target 820 can be placed so that part of the target 820 is in a focal plane of the amplified light beam 810, or the target 820 can be placed away from the focal plane. In some implementations, the amplified light beam 810 can be approximated as a Gaussian beam, and the target 820 can be placed outside of the depth of focus of the amplified light beam 810.

In the example shown in FIG. 8C, the majority of the intensity of the pre-pulse 806 strikes the initial target 818 above the center of mass 819, causing the mass in the initial target 818 to tilt away from the pre-pulse 806. However, in other examples, the pre-pulse 806 can be applied below the center of mass 819, causing the target 820 to be tilted toward the direction 812 of propagation of the amplified light beam 810. In the example shown in FIG. 8C, the initial target 818 drifts through the initial target location 831 in the "–y" direction. Thus, the portion of the initial target 818 upon which the pre-pulse 806 is incident can be controlled with the timing of the pre-pulse 806. For example, releasing the pre-pulse 806 at an earlier time than the example shown in FIG. 8C (that is, increasing the delay time 811 of FIG. 8B), causes the pre-pulse 806 to strike the lower portion of the initial target 818.

The pre-pulse 806 can be any type of radiation that can act on the initial target 818 to form the target 820. For example, the pre-pulse 806 can be a pulsed optical beam generated by a laser. The pre-pulse 806 can have a wavelength of 1-10 µm. The duration 812 of the pre-pulse 806 can be, for example, 20-70 nanoseconds (ns), less than 1 ns, 300 picoseconds (ps), between 100-300 ps, between 10-50 ps, or between 10-100 ps. The energy of the pre-pulse 806 can be, for example, 15-60 milliJoules (mJ). When the pre-pulse 806 has a duration of 1 ns or less, the energy of the pre-pulse 806 can be 2 mJ. The delay time 811 can be, for example, 1-3 microseconds (µs).

Although the waveform 802 is shown as a single waveform as a function of time, various portions of the waveform 802 can be produced by different sources. Furthermore, although the pre-pulse 806 is shown as propagating in the direction 812, this is not necessarily the case. The pre-pulse 806 can propagate in another direction and still cause the initial target 818 to tilt. For example, the pre-pulse 806 can propagate in a direction that is at the angle 827 relative to the z direction. When the pre-pulse 806 travels in this direction and impacts the initial target 818 at the center of mass 819, the initial target 818 expands along the y' axis and is tilted. Thus, in some implementations, the initial target 818 can be tilted relative to the direction of propagation of the amplified light beam 810 by striking the initial target 818 on-center or at the center of mass 819. Striking the initial target 818 in this manner causes the initial target 818 to flatten or expand along a direction that is perpendicular to the direction in which the pre-pulse 806 propagates, thus angling or tilting the initial target 818 relative to the z axis. Additionally, in other examples, the pre-pulse 806 can propagate in other directions (for example, into the page of FIG. 8C and along the x axis) and cause the initial target 818 to flatten and tilt relative to the z axis.

As discussed above, the impact of the pre-pulse 806 on the initial target 818 deforms the initial target 818. In implementations in which the initial target 818 is a droplet of molten metal, the impact transforms the initial target 818 into a shape that is similar to a disk, the disk expands into the target 820 over the time of the delay 811. The target 820 arrives in the target location 830.

Although FIG. 8C illustrates an implementation in which the initial target 818 expands into the target over the delay 811, in other implementations, the target 820 is tilted and expanded along a direction that is orthogonal to the direction of propagation of the pre-pulse 806 by adjusting the spatial position of the pre-pulse 806 and the initial target 818 relative to each other, and without necessarily using the delay 811. In this implementation, the spatial position of the pre-pulse 806 and the initial target 818 are adjusted relative to each other. Due to this spatial offset, an interaction between the pre-pulse 806 and the initial target 818 causes the initial target 818 to tilt in a direction that is orthogonal to the direction of propagation of the pre-pulse 806. For example, the pre-pulse 806 can propagate into the page of FIG. 8C to expand and tilt the initial target 818 relative to the direction of propagation of the amplified light beam 810.

Figure 9C:
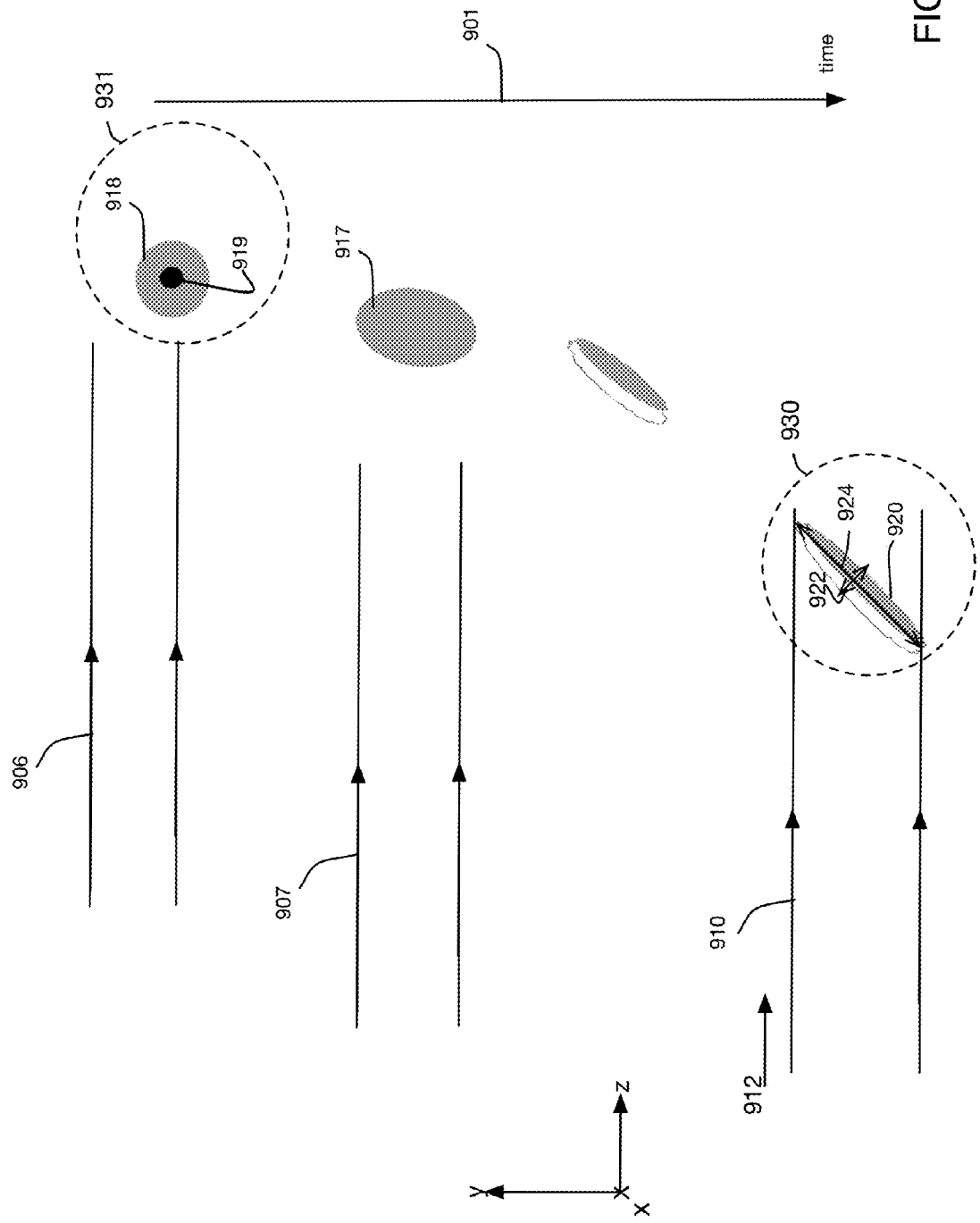
FIG. 9C shows side views of the initial target and the target of FIG. 9A.

Thus, and referring again to the process 700 of FIG. 7, FIGS. 8A-8C disclose an example of providing a target to a target location. Another example of providing a target to a target location is shown in FIGS. 9A-9C. As compared to the example of FIGS. 8A-8C, the example of FIGS. 9A-9C uses a plurality of pre-pulses to transform an initial target 918 into a target 920. An example of a technique of irradiating target material with a plurality of pre-pulses is disclosed in U.S. application Ser. No. 13/830,461, the contents of which are incorporated herein by reference.

Referring to FIGS. 9A and 9B, an exemplary waveform 902 transforms an initial target 918 into a target 920. The discussion below provides an example in which the initial target 918 is a target material droplet made of molten metal. However, the initial target 918 can take other forms.

FIGS. 9A and 9C show the initial target 918 physically transforming into an intermediate target 917 and then into the target 920 over a time period 901. The initial target 918 is transformed through interaction with the radiation delivered in time according to the waveform 902. FIG. 9B is a plot of the energy in the waveform 902 as a function of time over the time period of FIG. 9A. As compared to the initial target 918 and the intermediate target 917, the target 920 absorbs more of an amplified light beam 910 (FIG. 9C) and converts a larger portion of the energy in the amplified light beam 910 to EUV light 960.

The waveform 902 is a representation of the energy that interacts with the initial target 918 and its modified forms over time. Although the waveform 902 is shown as a single waveform as a function of time, various portions of the waveform 902 can be produced by different sources. The waveform 902 includes a representation of a first pulse of radiation 906 (a first pre-pulse 906) and a representation of a second pulse of radiation 907 (a second pre-pulse 907). The first pre-pulse 906 and the second pre-pulse 907 can be any type of pulsed radiation that has sufficient energy to act on the initial target 918 and the intermediate target 917, respectively. The first and second pre-pulses 906, 907 do not convert the target material to plasma.

The first pre-pulse 906 occurs at a time $t=t_1$ and has a pulse duration 915, and the second pre-pulse 907 occurs at a time $t=t_2$ and has a pulse duration 914. The pulse duration 915 can be represented by the full width at half maximum, the amount of time that the pulse has an intensity that is at least half of the maximum intensity of the pulse. However, other metrics can be used to determine the pulse duration 915. The times $t_1$ and $t_2$ are separated by a first delay time 911, with the second pre-pulse 907 occurring after the first pre-pulse 906.

The waveform 902 also shows a representation of the amplified light beam 910. The amplified light beam 910 can be referred to as the main beam or the main pulse. The amplified light beam 910 has sufficient energy to convert target material in the target 920 to plasma that emits the EUV light 960. The second pre-pulse 907 and the amplified light beam 910 are separated in time by a second delay time 913, with the amplified light beam 910 occurring after the second pre-pulse 907 and the second pre-pulse 907 occurring after the first pre-pulse 906.

The example of FIGS. 9A-9C applies two pre-pulses to a target material droplet to form the target 920. Similar to the example of FIGS. 8A-8B, the first pre-pulse 906 is directed toward an initial target location 931 and forms a geometric distribution of target material that becomes the intermediate target 917. The interaction of the first pre-pulse 906 and the initial target 918 expands the initial target 918 into the intermediate target 917, which occupies a larger volume than the initial target 918. The first pre-pulse 906 also irradiates the initial target 918 off of a center of mass 919 of the initial target 918, and causes the initial target 918 to begin to tilt. The second pre-pulse 907 transforms the intermediate target 917 into the target 920.

The second pre-pulse 907 impinges on the intermediate target 917. The interaction between the intermediate target 917 and the second pre-pulse 907 forms the target 920 before the amplified light beam 910 arrives. The second pre-pulse 907 has energy sufficient to change a property of the intermediate target 917 that is related to absorption of radiation. In other words, striking the intermediate target 917 with the second pre-pulse 907 changes the ability of the altered droplet to absorb radiation, such as light.

In one example, the intermediate target 917 is a disk of molten tin that, as compared to the initial target 918, is thinner along a direction of propagation of an incident pulse of radiation. This intermediate target 917 is more easily broken into fragments of target material than the initial target 918, and a smaller amount of energy may be needed to fragment the intermediate target 917. In this example, the second pre-pulse 907 transforms the intermediate target 917 into a cloud of pieces of target material that, taken together or collectively, have a greater surface area of target material in the path of an oncoming pulse of radiation as compared to the initial target 918. The greater surface area provides more target material for interaction with the amplified light beam 910 and can lead to increased ionization of the target material and therefore increased EUV light generation.

In another example, the intermediate target 917 is again a disk of molten tin that is thinner and wider than the target material droplet. In this example, the second pre-pulse 907 irradiates the intermediate target 917 and generates a cloud of electrons and ions (a pre-plasma) close to the surface of the intermediate target that receives the second pulse of radiation. A pre-plasma is plasma that is used to enhance absorption of incident light (such as the pre-pulse 907 or the amplified light beam 910). Although the pre-plasma can emit small amounts of EUV light in some instances, the EUV light that is emitted is not of the wavelength or amount that is emitted by the entire target 920. By creating the cloud of electrons and ions at the surface of the intermediate target 917, the second pre-pulse 907 alters the electron density and/or the ion density of at least a portion of the intermediate target 917. The pre-plasma is allowed to expand over the delay time 913, and the expanded pre-plasma and the bulk target material form the target 920 continues to tilt and drifts into the target location 930 tilted relative to the direction of propagation of the amplified light beam 910. Additionally, the density profile of the pre-plasma can increase in the direction of propagation of the pre-pulse 907. Thus, because the pre-plasma continues to tilt before reaching the target location 930, the amplified light beam 910 interacts with a larger portion of the relatively low density portions of the pre-plasma as compared to a case where the target 920 is perpendicular to the direction of propagation 912 of the amplified light beam 910.

Thus, the target 920 can be a pre-plasma that is spatially near to a bulk target material. In some implementations, the target 920 is a volume of fragments or a mist of target material. In yet other implementations, the target 920 is a pre-plasma formed close to a collection of particles of target material distributed throughout a hemisphere shaped volume.

The first pre-pulse 906 can be any type of radiation that can act on the initial target 918 to form the target 920. For example, the first pre-pulse 906 can be a pulsed optical beam generated by a laser. The first pre-pulse 906 can have a wavelength of 1-10.6 μm. The duration 915 of the first pre-pulse 906 can be, for example, 20-70 nanoseconds (ns), less than 1 ns, 300 picoseconds (ps), between 100-300 ps, between 10-50 ps, or between 10-100 ps. The energy of the first pre-pulse 906 can be, for example, 15-60 milliJoules (mJ). When the pre-pulse 806 has a duration of 1 ns or less, the energy of the pre-pulse 806 can be, for example, 2 mJ.

The second pre-pulse 907 can have a duration of at least 1 ns and an energy of 1-10 mJ. For example, the second pre-pulse 907 can have a duration of 10 ns and an energy of 5 mJ. The second pre-pulse 907 of radiation can have a wavelength 1-10.6 μm. For example, the second pre-pulse 907 can have a wavelength of 1.06 μm. The energy of the second pre-pulse 907 can be lower and/or the pulse duration can be longer than the first pre-pulse 906, which is applied directly to the initial target 918. The delay time 913 can be, for example, 10-100 ns or 1-200 ns. In implementations in which the second pre-pulse 907 forms a pre-plasma, the delay time 913 between the second pre-pulse 907 and the amplified light beam 910 can be a time that is long enough to allow the pre-plasma to expand.

In some implementations, the pulse duration 915 of the first pre-pulse 906 and the pulse duration 914 of the second pre-pulse 907 are 1 ns or greater. Using two pre-pulses that are greater than 1 ns allows the target 920 to be produced using pulses of radiation that are generated without using a laser that generates picosecond (ps) or shorter pulses. Lasers that emit ns-duration pulses and have relatively high repetition rates (50 kHz-100 kHz) can be more readily available than those that emit ps-pulses. Use of higher-repetition rate ns-pulse generating lasers to generate the pre-pulses 906 and 907 allows an EUV light source that uses the target 920 to have a higher overall system repetition rate.

As discussed above, the impact of the first pre-pulse 906 on the initial target 918 can deform the initial target 918 into a shape that is similar to a disk, in implementations in which the initial target 918 is a droplet of molten metal, the disk expands into a disk-shaped piece of molten metal over the time of the delay 911. The second pre-pulse 907 changes an absorption characteristic of the intermediate target 917 to form the target 920, which more readily absorbs radiation than the initial target 918. The target 920 has an extent 922 and an extent 924, which is greater than and perpendicular to the extent 922. The target 920 is tilted relative to the direction of propagation 912 of the amplified light beam 910, with the direction along which the extent 924 extends forming an angle with the direction 912. The target location 930 can coincide with or by outside of a focal plane (not shown) of the amplified light beam 910.

Thus, and referring again to the process 700 of FIG. 7, FIGS. 9A-9C disclose an example of providing a target to a target location.

Although two pre-pulses 906 and 907 are used in the example of FIGS. 9A-9C, additional pre-pulses can be used to further condition the initial target 918 to form the target 920.

Figure 10:
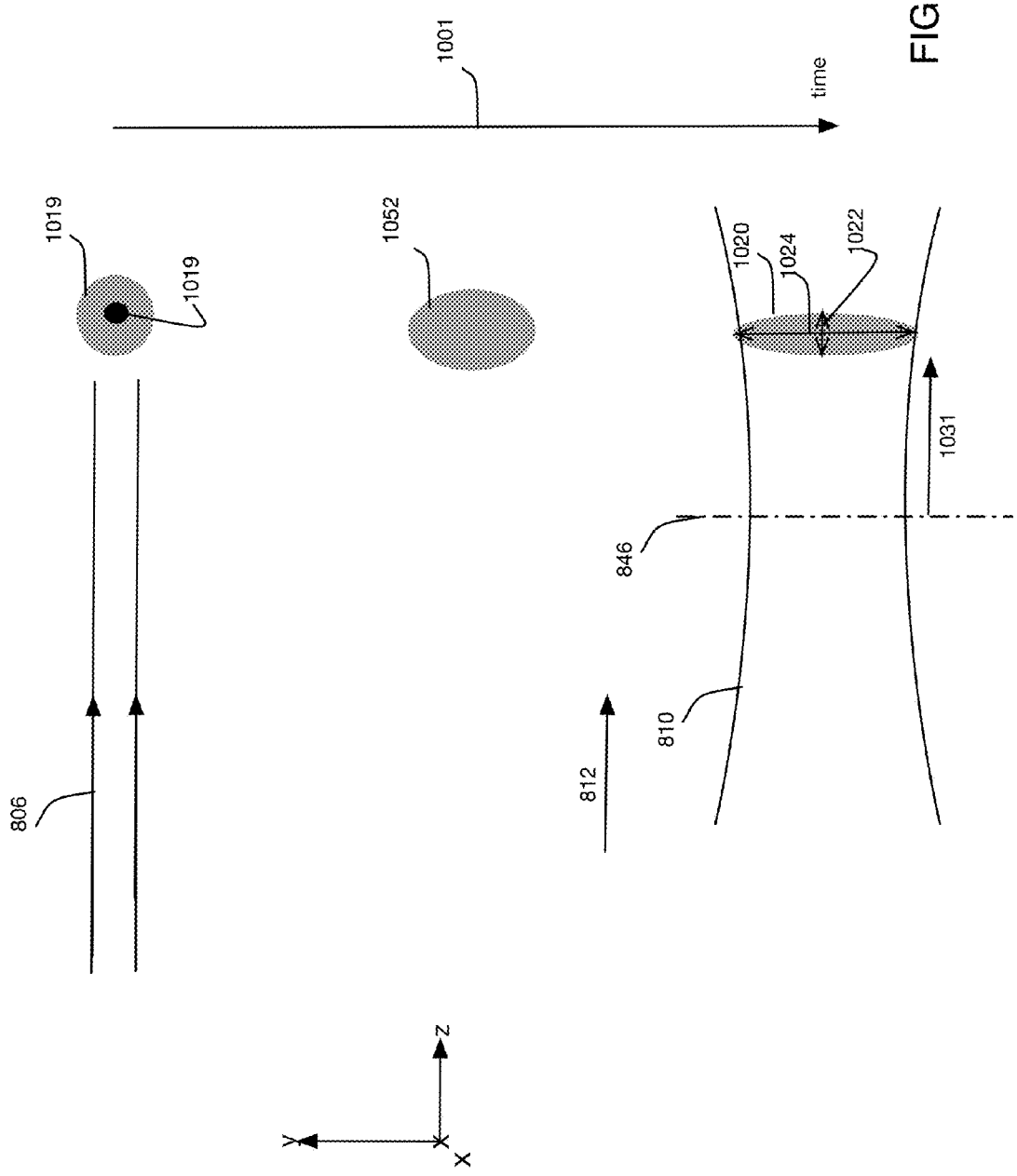
FIG. 10 shows side views of another exemplary initial target being converted into a target.
Figure 11:
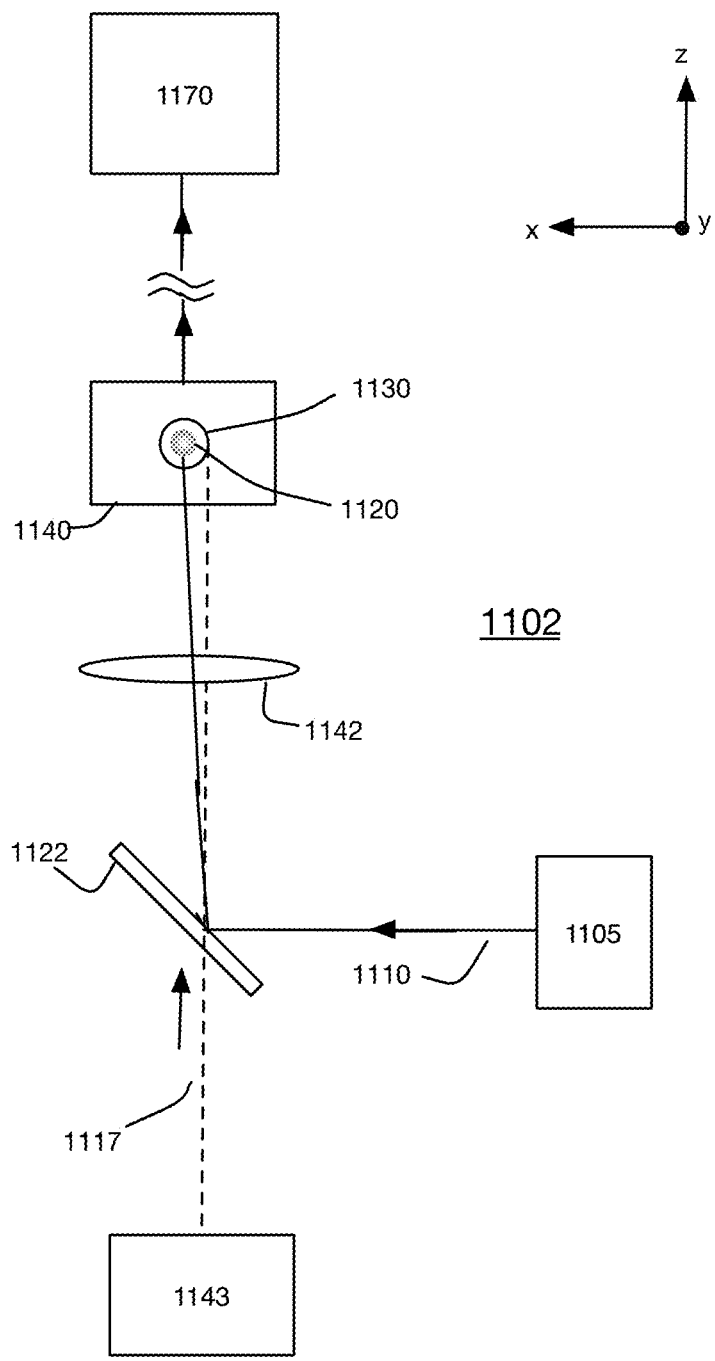
FIG. 11 is a top plan view of another laser produced plasma extreme ultraviolet (EUV) light source and a lithography tool coupled to the EUV light source.

Another example of providing a target to a target location is shown in FIG. 10. In the examples of FIGS. 8A-8C and 9A-9C, the target is tilted relative to the direction of propagation of the amplified light beam, and the target can partially coincide with the focal plane of the amplified light beam or the target can be outside of the focal plane or the depth of focus. In the example of FIG. 10, a target 1020 is provided to a target location 1030. The target 1020 is not tilted relative to a direction of propagation of the amplified light beam 810, and the target 1020 is outside of a focal plane 846 of the amplified light beam 810.

The waveform 802 (FIG. 8A) can be used to generate the target 1020. The pre-pulse 806 strikes an initial target 1018. The pre-pulse 806 irradiates the initial target 1018 with equal intensity on both sides of the center of mass 1019 of the initial target 1018. Thus, the pre-pulse 806 does not cause the initial target 1018 to tilt. However, the pre-pulse 806 causes the initial target 1018 to expand spatially into an intermediate target 1052. During the delay time 811, the intermediate target 1052 continues to expand and drifts into the target location 1030. Thus, the target 1020 is provided to the target location 1030.

The target 1020 has an extent 1022 along a direction 1021. The direction 1021 is parallel to a direction of propagation of the amplified light beam 1010. The target 1020 also has an extent 1024 in a direction 1023. The direction 1023 is perpendicular to the direction of propagation 812. In the example shown, the extent 1024 is greater than the extent 1022. Such an arrangement of the target 1020 relative to the amplified light beam 810 can improve conversion efficiency. The increased efficiency is due to the relatively thinness of the target 1020, which can result in the amplified light beam 810 being able to irradiate a larger portion of the target 1020 in the direction 812 before reaching a "critical surface" and the relative breadth in the direction 1023, which can result in the target 1020 occupying most or all of the width of the amplified light beam 810. As such, the shape of the target 1020 aids in effective use of the energy in the amplified light beam 810.

The amplified light beam 810 is focused to the focal plane 846, and the target 1020 is a distance 1031 downstream of the focal plane 846. The distance 1031 can be, for example, less than the Rayleigh range, or 2-3 greater than the Rayleigh range. In some implementations, the distance 1031 can be 1 mm. The target location 1030 can be upstream of the focal plane 846.

The amplified light beam 1010 interacts with the target 1020 and converts at least a portion of the target 1020 to EUV light.

Referring to FIG. 11, a top plan view of an exemplary optical imaging system 1100 is shown. The optical imaging system 1100 includes an LPP EUV light source 1102 that provides EUV light to a lithography tool 1170. The light source 1102 can be similar to, and/or include some or all of the components of, the light source 100 of FIG. 1.

The system 1100 includes an optical source such as a drive laser system 1105, an optical element 1122, a pre-pulse source 1143, a focusing assembly 1142, and a vacuum chamber 1140. The drive laser system 1105 produces an amplified light beam 1110. The amplified light beam 1110 has energy sufficient to convert target material in a target 1120 into plasma that emits EUV light. Any of the targets discussed above can be used as the target 1120.

The pre-pulse source 1143 emits pulses of radiation 1117. The pulses of radiation can be used as the pre-pulse 806 (FIG. 8A-8C, FIG. 10) or as the pre-pulses 806 and/or 807 (FIGS. 9A-9C). The pre-pulse source 1143 can be, for example, a Q-switched Nd:YAG laser that operates at a 50 kHz repetition rate, and the pulses of radiation 1117 can be pulses from the Nd:YAG laser that have a wavelength of 1.06 µm. The repetition rate of the pre-pulse source 1143 indicates how often the pre-pulse source 1143 produces a pulse of radiation. For the example where the pre-pulse source 1143 has a 50 kHz repetition rate, a pulse of radiation 1117 is emitted every 20 microseconds (µs).

Other sources can be used as the pre-pulse source 1143. For example, the pre-pulse source 324 can be any rare-earth-doped solid state laser other that an Nd:YAG, such as an erbium-doped fiber (Er:glass) laser. In another example, the pre-pulse source can be a carbon dioxide laser that produces pulses having a wavelength of 10.6 µm. The pre-pulse source 1143 can be any other radiation or light source that produces light pulses that have an energy and wavelength used for the pre-pulses discussed above.

The optical element 1122 directs the amplified light beam 1110 and the pulses of radiation 1117 from the pre-pulse source 1143 to the chamber 1140. The optical element 1122 is any element that can direct the amplified light beam 1110 and the pulses of radiation 1117 along similar or the same paths. In the example shown in FIG. 11, the optical element 1122 is a dichroic beamsplitter that receives the amplified light beam 1110 and reflects it toward the chamber 1140. The optical element 1122 receives the pulses of radiation 1117 and transmits the pulses toward the chamber 1140. The dichroic beamsplitter has a coating that reflects the wavelength(s)s of the amplified light beam 1110 and transmits the wavelength(s) of the pulses of radiation 1117. The dichroic beamsplitter can be made of, for example, diamond.

In other implementations, the optical element 1122 is a mirror that defines an aperture (not shown). In this implementation, the amplified light beam 1110 is reflected from the mirror surface and directed toward the chamber 1140, and the pulses of radiation pass through the aperture and propagate toward the chamber 1140.

In still other implementations, a wedge-shaped optic (for example, a prism) can be used to separate the main pulse 1110 and the pre-pulse 1117 into different angles, according to their wavelengths. The wedge-shaped optic can be used in addition to the optical element 1122, or it can be used as the optical element 1122. The wedge-shaped optic can be positioned just upstream (in the "−z" direction) of the focusing assembly 1142.

Additionally, the pulses 1117 can be delivered to the chamber 1140 in other ways. For example, the pulses 1117 can travel through optical fibers that deliver the pulses 1117 to the chamber 1140 and/or the focusing assembly 1142 without the use of the optical element 1122 or other directing elements. In these implementations, the fibers bring the pulses of radiation 1117 directly to an interior of the chamber 1140 through an opening formed in a wall of the chamber 1140.

The amplified light beam 1110 is reflected from the optical element 1122 and propagates through the focusing assembly 1142. The focusing assembly 1142 focuses the amplified light beam 1110 at a focal plane 1146, which may or may not coincide with a target location 1130. The pulses of radiation 1117 pass through the optical element 1122 and are directed through the focusing assembly 1142 to the chamber 1140. The amplified light beam 1110 and the pulses of radiation 1117, are directed to different locations along the "x" direction in the chamber 1140 and arrive in the chamber 1140 at different times.

In the example shown in FIG. 11, a single block represents the pre-pulse source 1143. However, the pre-pulse source 1143 can be a single light source or a plurality of light sources. For example, two separate sources can be used to generate a plurality of pre-pulses (such as the pre-pulses 906 and 907 of FIGS. 9A-9C). The two separate sources can be different types of sources that produce pulses of radiation having different wavelengths and energies. For example, one of the pre-pulses can have a wavelength of 10.6 µm and be generated by a $CO_2$ laser, and the other pre-pulse can have a wavelength of 1.06 µm and be generated by a rare-earth-doped solid state laser.

In some implementations, the pre-pulses 1117 and the amplified light beam 1110 can be generated by the same source. For example, the pre-pulse of radiation 1117 can be generated by the drive laser system 1105. In this example, the drive laser system can include two $CO_2$ seed laser subsystems and one amplifier. One of the seed laser subsystems can produce an amplified light beam having a wavelength of 10.26 µm, and the other seed laser subsystem can produce an amplified light beam having a wavelength of 10.59 µm. These two wavelengths can come from different lines of the $CO_2$ laser. In other examples, other lines of the $CO_2$ laser can be used to generate the two amplified light beams. Both amplified light beams from the two seed laser subsystems are amplified in the same power amplifier chain and then angularly dispersed to reach different locations within the chamber 1140. The amplified light beam with the wavelength of 10.26 µm can be used as the pre-pulse 1117, and the amplified light beam with the wavelength of 10.59 µm can be used as the amplified light beam 1110. In implementations that employ a plurality of pre-pulses, such as the example of FIGS. 9A-9C, three seed lasers can be used, one of which is used to generate each of the amplified light beam 1110, a first pre-pulse, and a second, separate pre-pulse.

The amplified light beam 1110 and the pre-pulse of radiation 1117 can all be amplified in the same optical amplifier. For example, the three or more power amplifiers can be used to amplify the amplified light beam 1110 and the pre-pulse 1117.

Figure 12:
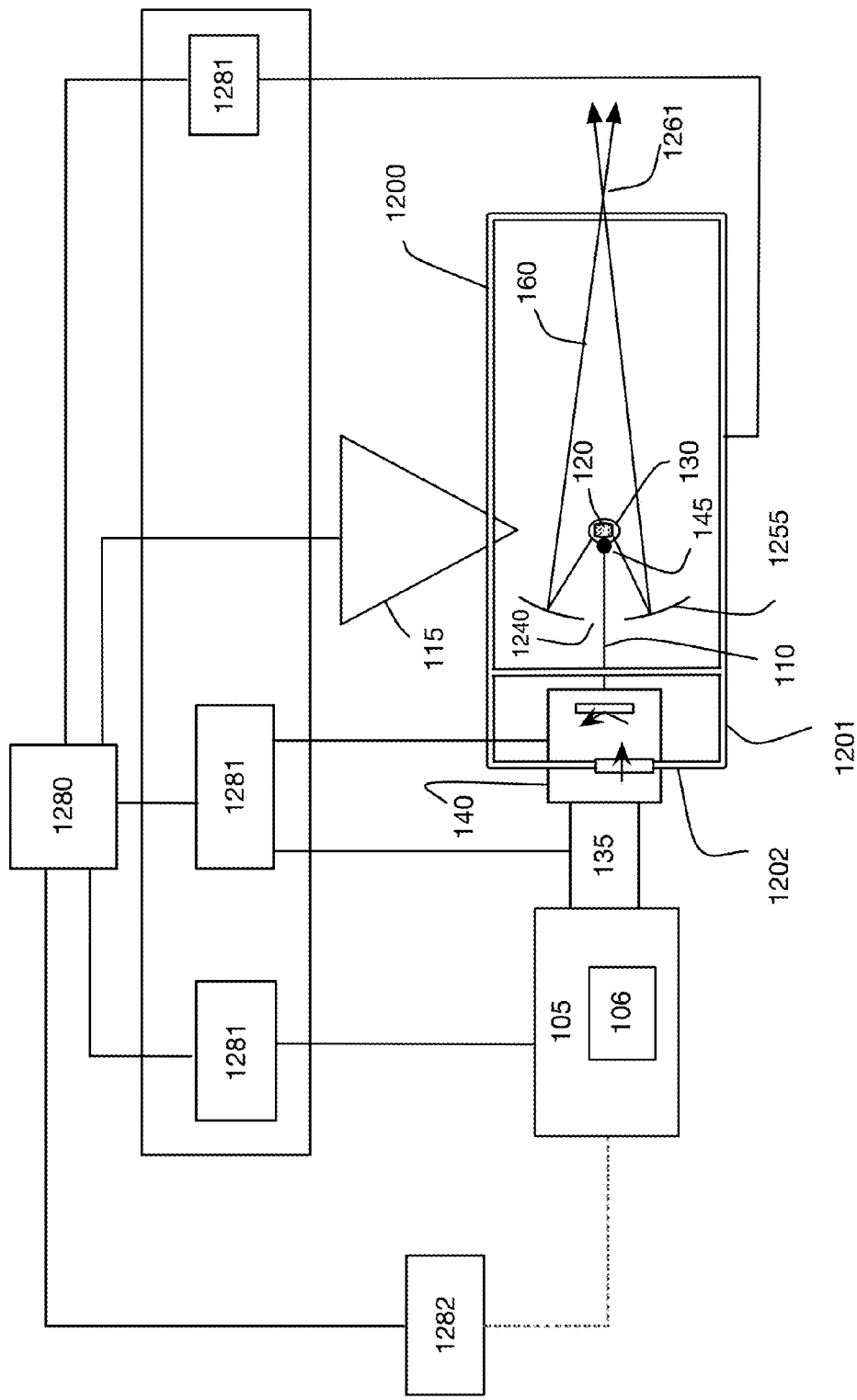
FIG. 12 is a block diagram of an exemplary laser produced plasma extreme ultraviolet light (EUV) source.

Referring to FIG. 12, in some implementations, the extreme ultraviolet light system 100 is a part of a system that includes other components, such as a vacuum chamber 1200, one or more controllers 1280, one or more actuation systems 1281, and a guide laser 1282.

The vacuum chamber 1200 can be a single unitary structure or it can be set up with separate sub-chambers that house specific components. The vacuum chamber 1200 is at least a partly rigid enclosure from which air and other gases are removed by a vacuum pump, resulting in a low-pressure environment within the chamber 1200. The walls of the chamber 1200 can be made of any suitable metals or alloys that are suitable for vacuum use (can withstand the lower pressures).

The target material delivery system 115 delivers the target material 120 to the target location 130. The target material 120 at the target location can be in the form of liquid droplets, a liquid stream, solid particles or clusters, solid particles contained within liquid droplets or solid particles contained within a liquid stream. The target material 120 can include, for example, water, tin, lithium, xenon, or any material that, when converted to a plasma state, has an emission line in the EUV range. For example, the element tin can be used as pure tin (Sn), as a tin compound, for example, $SnBr_4$, $SnBr_2$, $SnH_4$, as a tin alloy, for example, tin-gallium alloys, tin-indium alloys, tin-indium-gallium alloys, or any combination of these alloys. The target material 120 can include a wire coated with one of the above elements, such as tin. If the target material 120 is in a solid state, it can have any suitable shape, such as a ring, a sphere, or a cube. The target material 120 can be delivered by the target material delivery system 115 into the interior of the chamber 1200 and to the target location 130. The target location 130 is also referred to as an irradiation site, the place where the target material 120 optically interacts with the amplified light beam 110 to produce the plasma.

The drive laser system 105 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the drive laser system 105 produces the amplified light beam 110 due to the population inversion in the gain media of the laser amplifiers even if there is no laser cavity. Moreover, the drive laser system 105 can produce an amplified light beam 110 that is a coherent laser beam if there is a laser cavity to provide enough feedback to the drive laser system 105. The term "amplified light beam" encompasses one or more of: light from the drive laser system 105 that is merely amplified but not necessarily a coherent laser oscillation and light from the drive laser system 105 that is amplified and is also a coherent laser oscillation.

The optical amplifiers in the drive laser system 105 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the drive laser system 105 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the drive laser system 105 can also include a cooling system such as water that can be used when operating the drive laser system 105 at higher powers.

The light collector 155 can be a collector mirror 1255 having an aperture 1240 to allow the amplified light beam 110 to pass through and reach the focal region 145. The collector mirror 1255 can be, for example, an ellipsoidal mirror that has a first focus at the target location 130 or the focal region 145, and a second focus at an intermediate location 1261 (also called an intermediate focus) where the EUV light 160 can be output from the extreme ultraviolet light system and can be input to the optical apparatus 165.

The one or more controllers 1280 are connected to the one or more actuation systems or diagnostic systems, such as, for example, a droplet position detection feedback system, a laser control system, and a beam control system, and one or more target or droplet imagers. The target imagers provide an output indicative of the position of a droplet, for example, relative to the target location 130 and provide this output to the droplet position detection feedback system, which can, for example, compute a droplet position and trajectory from which a droplet position error can be computed either on a droplet by droplet basis or on average. The droplet position detection feedback system thus provides the droplet position error as an input to the controller 1280. The controller 1280 can therefore provide a laser position, direction, and timing correction signal, for example, to the laser control system that can be used, for example, to control the laser timing circuit and/or to the beam control system to control an amplified light beam position and shaping of the beam transport system to change the location and/or focal power of the beam focal spot within the chamber 1200.

The target material delivery system 115 includes a target material delivery control system that is operable in response to a signal from the controller 1280, for example, to modify the release point of the droplets as released by an internal delivery mechanism to correct for errors in the droplets arriving at the desired target location 130.

Additionally, extreme ultraviolet light system can include a light source detector that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector generates a feedback signal for use by the controller 1280. The feedback signal can be, for example, indicative of the errors in parameters such as the timing and focus of the laser pulses to properly intercept the droplets in the right place and time for effective and efficient EUV light production.

In some implementations, the drive laser system 105 has a master oscillator/power amplifier (MOPA) configuration with multiple stages of amplification and having a seed pulse that is initiated by a Q-switched master oscillator (MO) with low energy and high repetition rate, for example, capable of 100 kHz operation. From the MO, the laser pulse can be amplified, for example, using RF pumped, fast axial flow, $CO_2$ amplifiers to produce the amplified light beam 110 traveling along a beam path.

Although three optical amplifiers can be used, it is possible that as few as one amplifier and more than three amplifiers could be used in this implementation. In some implementations, each of the $CO_2$ amplifiers can be an RF pumped axial flow $CO_2$ laser cube having a 10 meter amplifier length that is folded by internal mirrors.

At the irradiation site, the amplified light beam 110, suitably focused by the focus assembly 142, is used to create plasma having certain characteristics that depend on the composition of the target material 120. These characteristics can include the wavelength of the EUV light 160 produced by the plasma and the type and amount of debris released from the plasma. The amplified light beam 110 evaporates the target material 120, and heats the vaporized target material to a critical temperature at which electrons are shed (a plasma state), leaving behind ions, which are further heated until they start emitting photons having a wavelength in the extreme ultraviolet range.

Other implementations are within the scope of the following claims.

Figure 13:
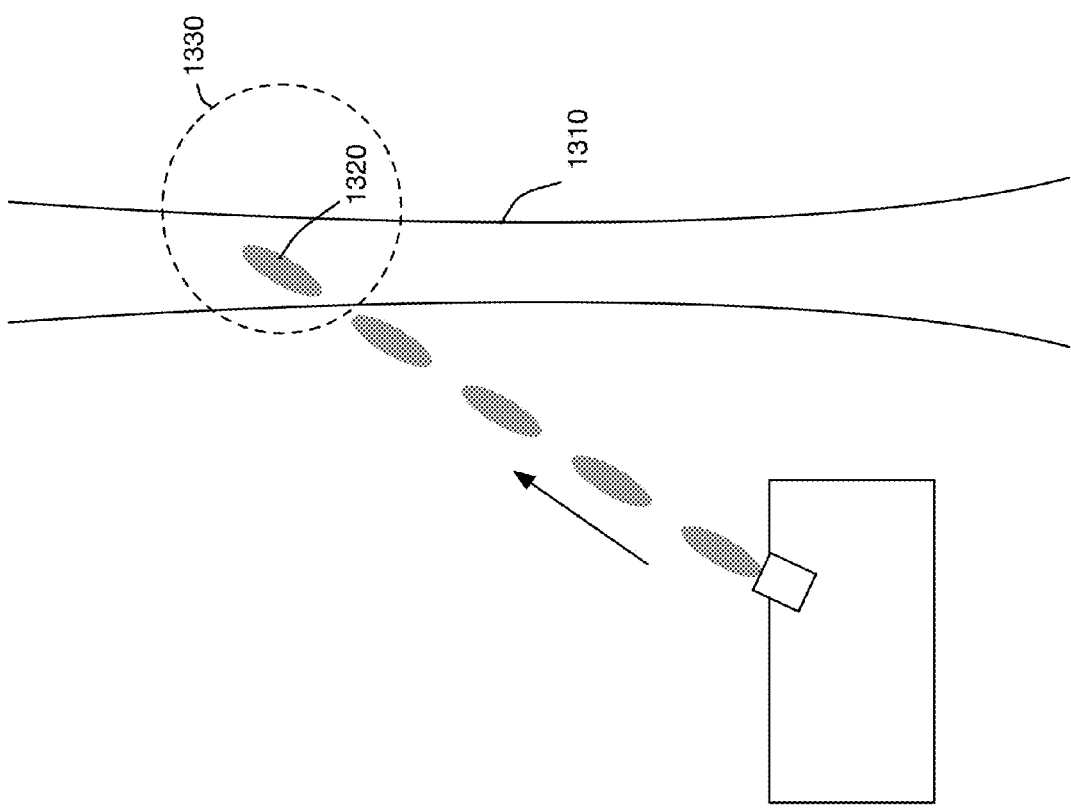
FIG. 13 is a side view of another exemplary target interacting with an amplified light beam.

For example, although the examples of FIGS. 8A-8C and 9A-9C show using a pre-pulse to initiate tilting of an initial target, a tilted target can be delivered to the target locations 830, 930 with other techniques that do not employ a pre-pulse. For example, as shown in FIG. 13, a disk-shaped target 1320 that includes target material that emits EUV light when converted to plasma is pre-formed and provided to a target location 1330 by releasing the disk target 1320 with a force that results in the disk target 1320 moving through the target location 1310 tilted relative to an amplified light beam 1310 that is received in the target location 1330.

Although a geometric-type isolator, a pinhole, is shown and discussed as the isolator 409 in FIGS. 4A-4D, in some implementations, the isolator 409 can be a filter that blocks or attenuates light based on polarization, wavelength, and/or intensity. For example, the isolator 409 can be a quarter-wave plate or a saturable absorber. Unlike geometric-type isolators, such as a pinhole, performance of isolators that are based on polarization, wavelength, and/or intensity do not directly depend on the angle at which light reaching the isolator propagates. However, adjusting a position of the target 220 away from the focal plane and/or tilting relative to a direction of propagation of the amplified light beam can also improve performance of these isolators. For example, these isolators are generally thermally sensitive, and their performance can be improved by reducing the amount of reflected light that is incident on these isolators.

What is claimed is:

1. A method of reducing back reflections in an extreme ultraviolet (EUV) light system, the method comprising:
   providing a target material that comprises a material that emits extreme ultraviolet light when converted to plasma and reflects light that propagates along a direction of propagation in a first direction;
   modifying a geometric distribution of the target material to form a modified target, the modified target comprising an optically reflective surface that reflects light that propagates along the direction of propagation in a second direction that is different from the first direction; and
   directing an amplified light beam from an optical source along the direction of propagation toward the reflective surface of the modified target, the amplified light beam converting at least part of the modified target to plasma that emits EUV light and producing a reflection of the amplified light beam that travels in the second direction, to thereby direct the reflection away from the source.

2. The method of claim 1, further comprising focusing the amplified light beam at a focal plane, and wherein the modified target is outside of the focal plane.

3. The method of claim 2, wherein focusing the amplified light beam at a focal plane comprises forming a beam waist of the amplified light beam in a region, and the modified target is outside of the region.

4. The method of claim 1, further comprising focusing the amplified light beam at a focal plane including forming a beam waist of the amplified light beam in a region, wherein the modified target overlaps the beam waist.

5. The method of claim 1, wherein:
   providing a target material comprises interacting a first beam of radiation and an instance of the target material to form the target material, the target material occupying a volume that is larger than a volume occupied by the instance of the target material in a first dimension and smaller in a second dimension; and
   modifying a geometric distribution of the target material comprises allowing a delay time to elapse after interacting the optical beam with the target material, the modified target moving to a target location and tilting relative to the direction of propagation during the delay time.

6. The method of claim 1, wherein:
   modifying a geometric distribution of the target material comprises directing a first beam of radiation toward the target material along a first direction of propagation that is different from the direction of propagation of the amplified light beam, the interaction causing the target material to expand in a direction that is orthogonal to the first direction of propagation and causing the target material to tilt relative to the direction of propagation of the amplified light beam.

7. The method of claim 1, wherein the modified target comprises a disk shaped volume of molten metal having a substantially planar surface.

8. The method of claim 7, wherein the substantially planar surface forms an angle between 0 and 90 degrees with the direction of propagation.

9. The method of claim 7, wherein the substantially planar surface forms an angle between 35 and 45 degrees with the direction of propagation.

10. The method of claim 1, wherein modifying the geometric distribution of the target material comprises interacting the target material with an optical beam to form the modified target.

11. A method of generating extreme ultraviolet (EUV) light, the method comprising:
    providing a target material at a target location, the target material comprising a material that emits extreme ultraviolet light when converted to plasma, and the target material extending in a first extent along a first direction and in a second extent along a second direction;
    directing an amplified light beam along a direction of propagation toward the target location;
    focusing the amplified light beam in a focal plane, the amplified light beam being in focus at a location that is along the direction of propagation and overlaps with the focal plane and the amplified light beam being out of focus at a location that is along the direction of propagation and outside of the focal plane; and
    interacting the amplified light beam with the target material while the target material is outside of the focal plane and at a location where the amplified light beam is out of focus, the interaction between the target material converting at least part of the target material to plasma that emits EUV light.

12. The method of claim 11, wherein the second extent of the target material is greater than the first extent of the target material, and the second direction and the direction of propagation form a non-zero angle.

13. The method of claim 12, wherein the second direction is between the direction of propagation and a direction that is perpendicular to the direction of propagation.

14. The method of claim 13, wherein the second direction forms an angle between 25 degrees and 45 degrees relative to the direction of propagation.

15. The method of claim 11, wherein providing the target material at the target location comprises:
provided an initial target material at an initial location; and
allowing a time to elapse, the initial target material traveling from the initial location to the target location during the time.

16. The method of claim 11, wherein providing the target material at the target location comprises:
providing an initial target material at an initial location, the initial target material comprising a central region, and at least two sides relative to the central region; and
directing a first beam of radiation toward a portion of the initial target material, the portion being on only one side of the initial target material.

17. The method of claim 16, further comprising generating the target material by allowing a time to elapse after an interaction between the first beam of radiation and the initial target material, wherein,
during the elapsed time, a size of the initial target material increases in at least one dimension and decreases in at least one dimension, and the initial target material tilts relative to the direction of propagation of the first beam of radiation.

18. The method of claim 16, wherein the side of the initial target material comprises an outer edge of the initial target material.

19. The method of claim 16, wherein the one side of the initial target material is a portion of the initial target material that comprises the central region of the initial target material.

20. The method of claim 16, wherein the initial target material comprises a target material droplet.

21. The method of claim 16, wherein generating the target material further comprises:

directing a second beam of radiation toward the target material after the first beam of radiation and before the target material is provided at the target location.

22. The method of claim 16, wherein the target material comprises a continuous segment of target material.

23. The method of claim 11, wherein the entire target material is outside of the focal plane.

24. An extreme ultraviolet (EUV) light source comprising:
a vacuum chamber that comprises an initial target location that receives the first beam of radiation and a target location that receives the amplified light beam;
a target material delivery system configured to provide target material to the initial target location, the target material comprising a material that emits EUV light when converted to plasma;
a source configured to produce a first beam of radiation and an amplified light beam, the amplified light beam comprising an energy sufficient to convert at least part of the target material to plasma that emits EUV light; and
an optical steering system configured to direct the amplified light beam toward the target location and focus the amplified light beam at a focal plane, wherein
the first beam of radiation has an energy sufficient to cause a change in a geometric distribution of the target material to form a modified target,
the target location receives the modified target, and
the target location is outside of the focal plane.

25. The EUV light source of claim 24, wherein the first beam of radiation is at least one pulse of a pulsed laser beam, and the source comprises a first laser source that produces the pulsed laser beam, and a second source, separate from the first, that produces the amplified light beam.

26. The EUV light source of claim 25, further comprising:
at least one optical amplifier; and
an isolator between the optical amplifier and the seed laser, wherein the at least one optical amplifier, and the isolator are on a beam path along which the amplified light beam propagates.

27. The EUV light source of claim 26, wherein the first pulse of radiation propagates on the beam path.

28. The EUV light source of claim 24, wherein the source comprises a seed laser.

* * * * *